(12) United States Patent
Gulati et al.

(10) Patent No.: US 9,030,863 B2
(45) Date of Patent: May 12, 2015

(54) READ/WRITE ASSIST FOR MEMORIES

(71) Applicant: QUALCOMM Incorporated, San Diego, CA (US)

(72) Inventors: Chirag Gulati, Kota (IN); Rakesh Kumar Sinha, Bangalore (IN); Ritu Chaba, San Diego, CA (US); Sei Seung Yoon, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/038,434

(22) Filed: Sep. 26, 2013

(65) Prior Publication Data

US 2015/0085568 A1    Mar. 26, 2015

(51) Int. Cl.
*G11C 11/00* (2006.01)
*G11C 11/419* (2006.01)
*H01L 27/11* (2006.01)

(52) U.S. Cl.
CPC .......... *G11C 11/419* (2013.01); *H01L 27/1104* (2013.01); *H01L 27/1116* (2013.01)

(58) Field of Classification Search
CPC .. G11C 11/16; G11C 11/405; G11C 11/4076; G11C 11/5607; G11C 15/02; G11C 15/046
USPC .......... 365/210.1, 189.011, 203, 230.03, 154, 365/189.07, 189.09
See application file for complete search history.

(56) References Cited

U.S. PATENT DOCUMENTS

| | | | |
|---|---|---|---|
| 6,525,979 B2 | 2/2003 | Kato | |
| 7,259,986 B2 | 8/2007 | Bhavnagarwala et al. | |
| 7,660,150 B2 | 2/2010 | Mikan, Jr. et al. | |
| 8,270,247 B2 | 9/2012 | Sasaki | |
| 8,331,132 B2 | 12/2012 | Cheng et al. | |
| 2004/0156230 A1 | 8/2004 | Satomi et al. | |
| 2006/0279986 A1* | 12/2006 | Suzuki | 365/185.2 |
| 2011/0317508 A1 | 12/2011 | Kulkarni et al. | |
| 2013/0003443 A1 | 1/2013 | Houston | |
| 2013/0064006 A1 | 3/2013 | Garg et al. | |
| 2013/0077387 A1 | 3/2013 | Yabuuchi | |
| 2013/0121088 A1 | 5/2013 | Yu et al. | |

OTHER PUBLICATIONS

International Search Report and Written Opinion - PCT/US2014/057281 - ISA/EPO - Jan. 5, 2015.

* cited by examiner

*Primary Examiner* — Thong Q Le
(74) *Attorney, Agent, or Firm* — Arent Fox LLP

(57) ABSTRACT

An integrated circuit includes one or more bit cells, a word line coupled to the one or more bit cells, and a dummy word line arranged with the word line to have a capacitance therebetween. The capacitance provides a voltage boost or reduction of the word line to assist read and write operations.

41 Claims, 18 Drawing Sheets

READ/WRITE ASSIST FOR MEMORIES

BACKGROUND

1. Field

The present disclosure relates generally to integrated circuits, and more particularly, to read/write assists for memory.

2. Background

Integrated circuits (or "chips") have revolutionized the electronic industry by enabling complex circuits consisting of millions of transistors, diodes, resistors and capacitors to be integrated into a chip of semiconductor material. Integration also provides other benefits such as batch manufacturing. The simultaneous manufacture of hundreds or even thousands of integrated circuits onto a single semiconductor wafer reduces cost and increases reliability of the end products.

Despite the manufacturing benefits of integrated circuits, process variations during the manufacturing process can have an impact on the electrical parameters of the chips, thereby leading to variations in performance. Statistically, most of the chips manufactured on a semiconductor wafer will have electrical parameters that meet the nominal specifications. A number of chips, however, will deviate from the nominal case towards the process corners. By way of example, a number of CMOS chips manufactured from a wafer may have both their PMOS and NMOS transistors operating at either a slow corner (SS) or a fast corner (FF). Other CMOS chips manufactured from the same wafer may have their transistors operating at cross corners where one type of transistor is faster and the other type of transistor is slower. By way of example, some CMOS chips may have a slow-fast (SF) corner with slow NMOS transistors and a fast PMOS transistors. Other CMOS chips may have a fast-slow corner (FS) with fast NMOS transistors and slow PMOS transistors.

Memory is a common circuit implemented within an integrated circuit. A static random access memory (SRAM) is just one example. The SRAM is memory that requires power to retain data. Unlike dynamic random access memory (DRAM), the SRAM does not need to be periodically refreshed. The SRAM also provides faster access to data than DRAM making it an attractive choice for many integrated circuit applications. Unfortunately, chips operating at the SF corner tend to have difficulty writing to SRAM and chips operating at the FS corner tend to have difficulty reading from SRAM.

Different read and write assist techniques have been used in the past. However, these techniques are often costly in terms of chip area and power consumption. Accordingly, there is a need in the art for new techniques and methods that provide read and write assist to memory and other circuits that occupy less chip areas and consume less power.

SUMMARY

One aspect of an integrated circuit includes one or more bit cells, a word line coupled to the one or more bit cells, and a dummy word line arranged with the word line to have a capacitance therebetween.

Another aspect of an integrated circuit includes one or more bit cells, a word line coupled to the one or more bit cells, and dummy word line means for affecting a voltage applied to the word line through a capacitive coupling therebetween.

One aspect of a method of manufacturing an integrated circuit includes forming a plurality of transistors and interconnecting the transistors to form one or more bit cells, forming a word line in a first conductive layer and interconnecting the word line to the one or more bit cells, and forming a dummy word line in a second conductive layer and arranging the dummy word line with the word line to form a capacitance therebetween.

One aspect of a method of controlling a word line coupled to one or more bit cells formed in an integrated circuit includes asserting the word line to access the one or more bit cells, and controlling a dummy word line to affect the voltage applied to the word line, the voltage being affected by the capacitive coupling between the word line and the dummy word line.

Other aspects of apparatuses and methods described herein will become readily apparent to those skilled in the art based on the following detailed description, wherein various aspects of apparatuses and methods are shown and described by way of illustration. These aspects may be implemented in many different forms and its details may be modified in various ways without deviating from the scope of the present invention. Accordingly, the drawings and detailed description provided herein are to be regarded as illustrative in nature and not as restricting the scope of the claims.

BRIEF DESCRIPTION OF THE DRAWINGS

Various aspects of apparatus and methods will now be presented in the detailed description by way of example, and not by way of limitation, with reference to the accompanying drawings, wherein.

DETAILED DESCRIPTION

Figure 1:
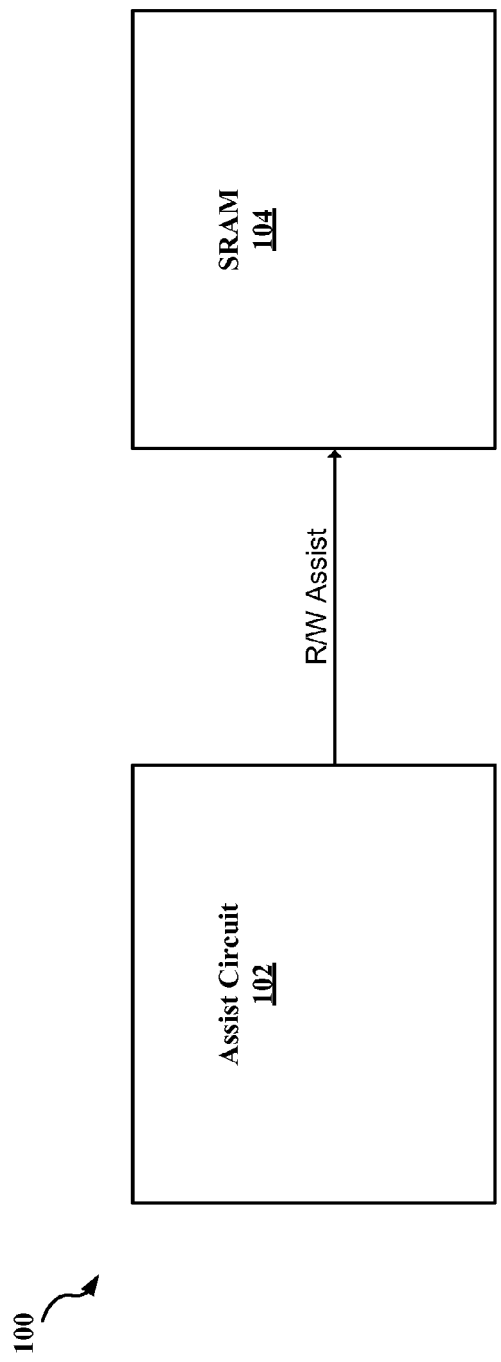
FIG. 1 is a functional block diagram illustrating an example of an integrated circuit.

Various aspects of the disclosure will be described more fully hereinafter with reference to the accompanying drawings. This disclosure may, however, be embodied in many different forms by those skilled in the art and should not be construed as limited to any specific structure or function presented herein. Rather, these aspects are provided so that this disclosure will be thorough and complete, and will fully convey the scope of the disclosure to those skilled in the art. Based on the teachings herein, one skilled in the art should appreciate that the scope of the disclosure is intended to cover any aspect of this disclosure, whether implemented independently of or combined with any other aspect of the disclosure. For example, an apparatus may be implemented or a method may be practiced using any number of the aspects set forth herein. In addition, the scope of the disclosure is intended to cover such an apparatus or method which is practiced using other structure, functionality, or structure and functionality in addition to or other than the various aspects of this disclosure. It should be understood that any aspect of the disclosure disclosed herein may be embodied by one or more elements of a claim.

Although particular aspects will be described herein, many variations and permutations of these aspects fall within the scope of the disclosure. Although some benefits and advantages of the preferred aspects are mentioned, the scope of the disclosure is not intended to be limited to particular benefits, uses, or objectives. Rather, aspects of the disclosure are intended to be broadly applicable to different circuits, technologies, systems, networks, and methods, some of which are illustrated by way of example in the figures and in the following description. The detailed description and drawings are merely illustrative of the disclosure rather than limiting, the scope of the disclosure being defined by the appended claims and equivalents thereof.

The various circuits described throughout this disclosure may be implemented in various forms of hardware. By way of example, any of these circuits, either alone or in combination, may be implemented as an integrated circuit, or as part of the design of an integrated circuit. The integrated circuit may be an end product, such as a microprocessor, a digital signal processor (DSP), an application specific integrated circuit (ASIC), programmable logic, memory, or any other suitable integrated circuitry. Alternatively, the integrated circuit may be integrated with other chips, discrete circuit elements, and/or other components as part of either an intermediate product, such as a motherboard, or an end product. The end product can be any suitable product that includes integrated circuits, including by way of example, a cellular phone, a personal digital assistant (PDA), laptop computer, a desktop computer (PC), a computer peripheral device, a multimedia device, a video device, an audio device, a global positioning system (GPS), a wireless sensor, or any other suitable device.

FIG. 1 is a functional block diagram illustrating one example of an integrated circuit. The integrated circuit 100 is shown with an assist circuit 102 and an SRAM 104. The assist circuit 102 may provide assistance to the SRAM during read and write operations. In some embodiments, the assist circuit 102 may be configured to provide either read assist or write assist to the SRAM 104. In other embodiments, the assist circuit 102 may be configured to provide both read and write assist to the SRAM 104. The SRAM 104 may be configured to operate with any of these embodiments without modification to its internal circuitry. In other words, the SRAM 104 can receive read assist, write assist, or both read and write assist from the assist circuit 102. Further embodiments will also be presented that speed up the read and write operations.

As will be explained in greater detail later, the SRAM includes an array of bit-cells. The array is arranged in rows and columns of bit-cells. Each row of bit-cells has a word line (WL) and a dummy word line (DWL). The DWL provides a means for affecting a voltage applied to the word line through a capacitive coupling therebetween. The assist circuit 102 provides a means for controlling the read word line and the dummy word line.

In the following detailed description, various aspects of an integrated circuit will be presented in the context of a read and/or write assist circuit in combination with memory, such as an SRAM. While these aspects may be well suited for this application, those skilled in the art will realize that these aspects may be extended to other forms of hardware. By way of example, various aspects presented throughout this disclosure may be applied to read and/or write assist for random access memory (RAM), static RAM (SRAM), double data rate RAM (DDRAM), cache, shift registers, register files, buffers, and other suitable memories. Accordingly, any reference to SRAM in this disclosure is intended only to illustrate various concepts, with the understanding that such concepts may have a wide range of applications.

An SRAM includes an array of bit-cells with supporting circuitry to decode addresses and perform read and write operations. The read and write operations are generally controlled by three signals provided by a processor or some other circuit that requires access to memory. The signals include a Chip Enable (CE) which allows multiple SRAM chips to be connected together to increase the size of memory, a Write Enable (WE) which allows data to be written to the SRAM, and an Output Enable (OE) which allows data to be read from the SRAM. The array of bit-cells is arranged in rows and columns. A word line is connected to each row of bit-cells and two complimentary bit-lines are attached to each column of bit-cells. Each bit-cell has a unique location or address defined by the intersection of a row and column. The number of bit-cells may be determined by a variety of factors including the size of the memory, the speed requirements of the memory, the layout and testing requirements, and the like. Typically, the array may include thousands of bit-cells.

Figure 2:
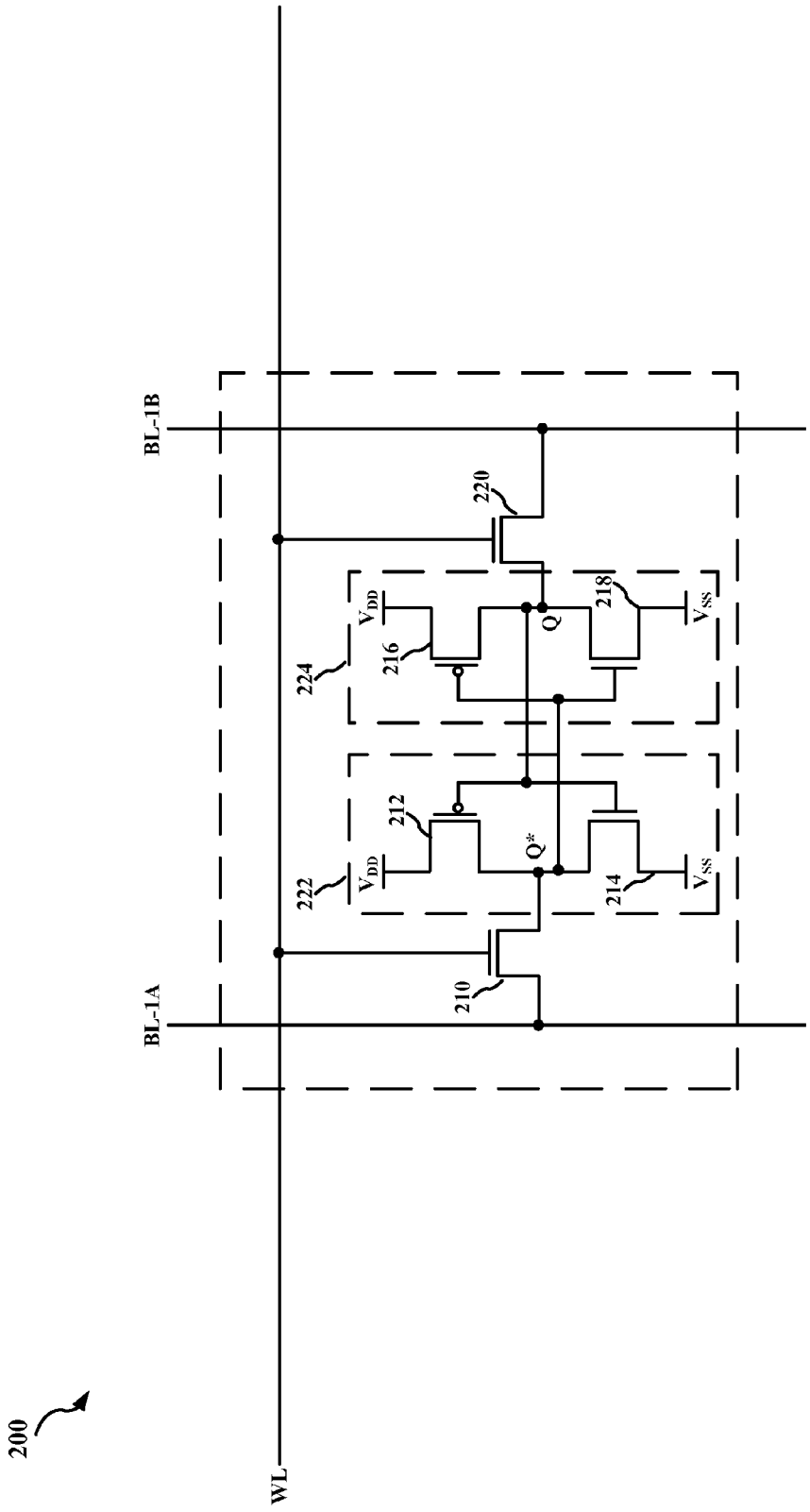
FIG. 2 is a schematic representation illustrating an example of a 6T bit-cell for an SRAM.

FIG. 2 is a schematic representation illustrating one example of a bit-cell 200 for an SRAM. The bit-cell 200 is implemented with a six-transistor (6T) configuration. However, as those skilled in the art will readily appreciate, the bit-cell 200 may be implemented with other transistor configurations. The operation of the SRAM, as well as the assist circuit, will be described in connection with two logic states represented by two voltage bands: one near the supply voltage $V_{DD}$ and one near the supply voltage return, typically ground, $V_{SS}$. The terms "high," "logic level 1," and "pulled-up" may be used to reference the band near the supply voltage $V_{DD}$. The terms "low," "logic level 0," and "pulled-down" may be used to reference the band near the supply voltage return.

The bit-cell 200 is shown with two inverters 222, 224. The first inverter 222 comprises a p-channel pull-up transistor 212 and an n-channel pull-down transistor 214. The second inverter 224 comprises a p-channel pull-up transistor 216 and an n-channel pull-down transistor 218. The first and second inverters 222, 224 are interconnected to form a cross-coupled latch. A first n-channel access transistor 210 couples the latch to a first bit-line BL-1A and a second n-channel access transistor 220 couples the latch to a second bit-line BL-1B. The gates of the n-channel access transistors 210, 220 are coupled to a word line WL. In the embodiments described herein, the read/write assist signal as discussed above with respect to FIG. 1 which may control the SRAM may be the word line WL.

The read operation is initiated by precharging both the bit-lines BL-1A, BL-1B to a logic level 1 and then asserting the word line WL. The word line WL is asserted by setting it high, thereby enabling both the access transistors 210, 220. With both the access transistors 210, 220 enabled, the value stored at the output Q* of the first inverter 222 is transferred to the first bit-line BL-1A and the value stored at the output Q of the second inverter 224 is transferred to the second bit-line BL-1B. By way of example, if the value stored at the output Q is a logic level 0 and the value stored at the output Q* is a logic level 1, the first bit-line BL-1A will remain in its pre-charged state, while the second bit-line BL-1B is pulled-down through the transistors 218, 220. If the value stored at the output Q is a logic level 1 and the value stored at the output Q* is a logic level 0, the first bit-line BL-1A is pulled-down through the transistors 214, 210 and the second bit-line BL-1B will remain in its pre-charged state. Either way, the bit-lines BL-1B, BL-1A are provided to a sense amplifier (not shown) which senses which line has the higher voltage to determine the state of the bit-cell 200.

The write operation is initiated by setting the bit-lines BL-1B, BL-1A to the value to be written to bit-cell 200 and then asserting the word line WL. By way of example, a logic level 1 may be written to the bit-cell 200 by setting the first bit-line BL-1A to a logic level 0 and the second lit-line BL-1B to a logic level 1. The logic level 0 at the first bit-line BL-1A forces the output Q* of the first inverter 222 to a logic level 0 through the access transistor 210. The logic level 1 at the second bit-line BL-2B forces the output Q of the second inverter 224 to a logic level 1 through the access transistor 220. The bit-line drivers (not shown) are designed to be stronger than the transistors in the bit-cell 200 so that they can override the previous state of the cross-coupled inverters 222, 224. The output Q* of the first inverter 222 is applied to the input of the second inverter 224, which reinforces the output Q of the second inverter 224 at a logic level 1. The output Q of the second inverter 224 is applied to the input of the first inverter 222, which reinforces the output Q* of the first inverter 222 at a logic level 0. A logic level 0 may be written to the bit-cell 200 by inverting the values of the bit-lines BL-1B, BL-1A.

When the word line WL is not asserted (i.e., a logic level 0), the access transistors 210, 220 disconnect the bit-lines BL-1B, BL-1A from the two inverters 222, 224. The output state of the bit-cell 200 is maintained by the cross-coupling between the two inverters 222, 224.

Figure 3:
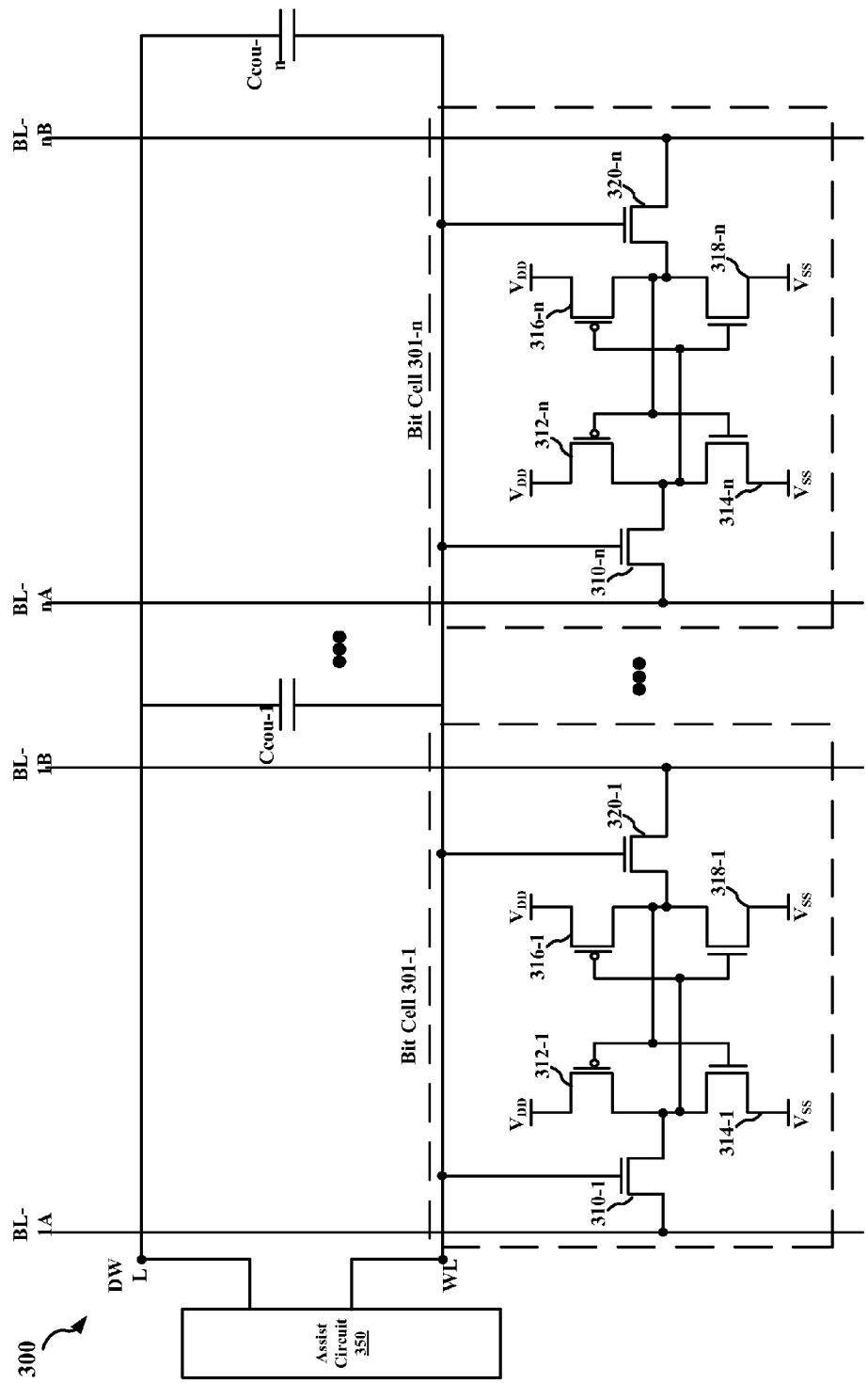
FIG. 3 is a schematic representation illustrating an example of a row of 6T bit-cells in an SRAM.

As explained earlier, the SRAM includes an array of bit-cells with supporting circuitry. The array is arranged in rows and columns of bit-cells. FIG. 3 is a schematic representation 300 illustrating one example of a row of bit-cells in an SRAM array. Bit Cell 301-1 includes six MOSFETs 310-1, 312-1, 314-1, 316-1, 318-1 and 320-1 and bit lines BL-1A and BL-1B. Bit Cell 301-$n$ includes six MOSFETs 310-$n$, 312-$n$, 314-$n$, 316-$n$, 318-$n$ and 320-$n$ and bit lines BL-$n$A and BL-$n$B. A word line WL is coupled to each of the bit-cells 301-1 . . . 301-$n$ to provide access to the SRAM. In this example, a dummy word line DWL may be used to boost the WL voltage during the write operation and decrease the WL voltage during the read operation. This may be achieved through capacitive coupling between the WL and DWL represented in FIG. 3 by $C_{cou}$-1 . . . $C_{cou}$-$n$. An assist circuit 350 may be used to control the WL and DWL.

Figure 4:
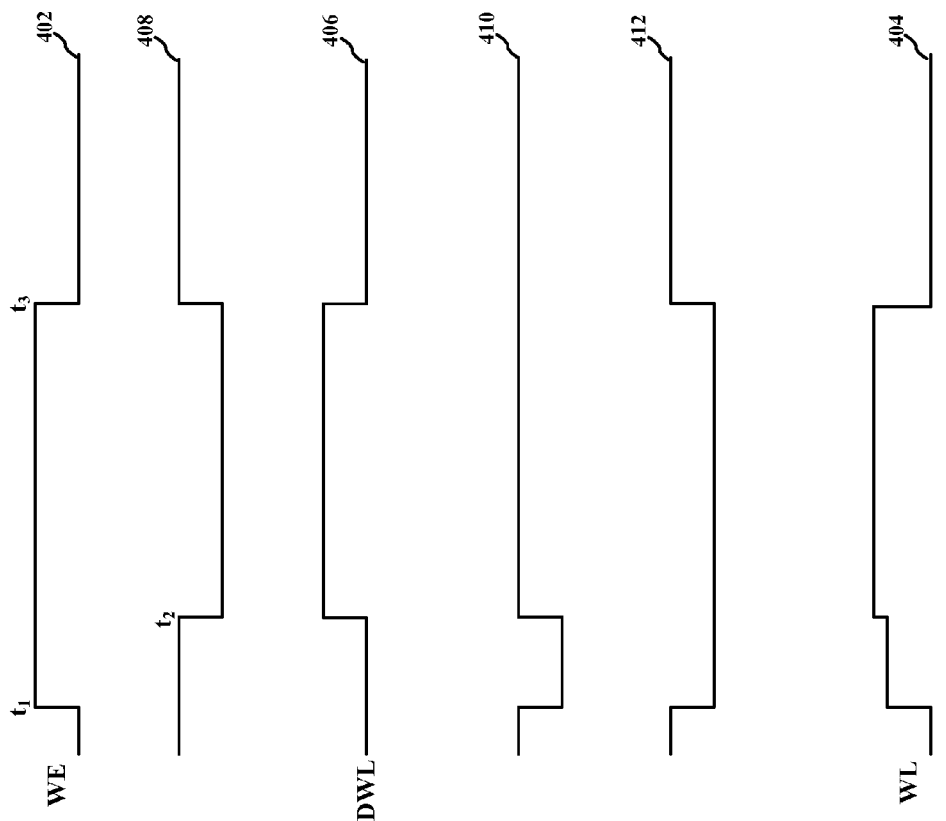
FIG. 4 is a timing diagram illustrating an example of the timing between a word line and a dummy word line for assisting a 6T bit-cell SRAM during a write operation.
Figure 5:
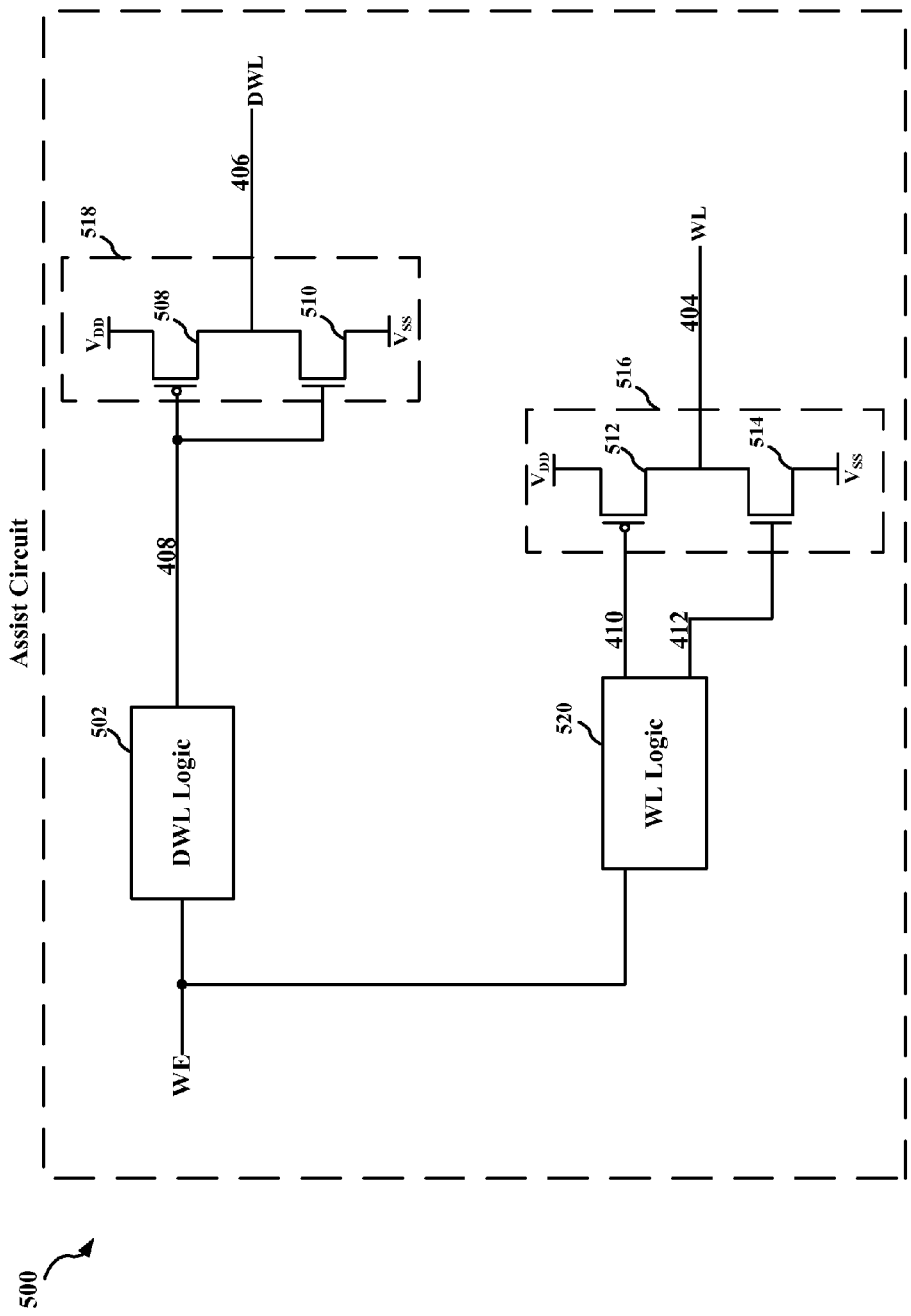
FIG. 5 is a schematic representation illustrating an example of an assist circuit operating in conjunction with a 6T bit-cell SRAM for write assist.

FIG. 4 is a timing diagram illustrating an example of the timing between the WL and the DWL for assisting an SRAM during a write operation. FIG. 5 is a schematic representation illustrating an example of an assist circuit 500 configured to provide write assist to a row of bit-cells having a 6T configuration. The same assist circuit 500 may be used to provide write assist to a row of bit-cells having an 8T bit-cell SRAM, an example of which is described below in connection with FIG. 11. The assist circuit 500 is shown with a DWL logic circuit 502 controlling a first CMOS driver 518 outputting the DWL and a WL logic circuit 520 controlling a second CMOS driver 516. The first CMOS driver 518 includes PMOS transistor 508 and NMOS transistor 510. The second CMOS driver 516 includes PMOS transistor 512 and NMOS transistor 514. The DWL logic circuit 502 and the WL logic circuit 520 may be implemented by any logic combination that results in the output signals 408, 410 and 412 shown in FIG. 4. Those skilled in the art will be readily able to design logic circuits best suited for the particular application and the overall design constraints imposed on the system.

Referring to FIGS. 4 and 5, the write operation is controlled by a processor or other circuit that requires access to memory. More specifically, the processor (or other circuit) transmits over a bus to the SRAM the data to written to memory, the address the data is to be written to, and a WE signal 402 to enable the write operation. When the SRAM is in standby mode, the WE signal 402 is low. The output 408 from DWL logic circuit 502 is high in response to the low WE signal 402, which turns the PMOS transistor 508 off and the NMOS transistor 510 on, thereby pulling down the DWL 406 to $V_{SS}$. The output 410 from WL logic circuit 520 is high in response to the low WE signal 402, which turns the PMOS transistor 512 off. The output 412 from the WL logic circuit 520 is also high in response to the low WE signal 402, which turns the NMOS transistor 514 on, thereby pulling down the WL 404 to $V_{SS}$.

The write operation is initiated by asserting the WE signal 402 at the processor or other device at $t_1$. When the WE 402 signal is asserted (i.e., high), the output 408 from DWL logic circuit 502 remains high, and therefore, the DWL 406 remains pulled down to $V_{SS}$. Both the outputs 410 and 412 from the WL logic circuit 520 go low, which turns the PMOS transistor 512 on and the NMOS transistor 514 off, respectively. The PMOS transistor 512 pulls up the WL 404 to $V_{DD}$.

At $t_2$, the output 408 from DWL logic circuit 502 goes low, which turns the PMOS transistor 508 on and the NMOS transistor 510 off, pulling up the DWL 406 to $V_{DD}$. At substantially the same time, the output 410 from the WL logic circuit 520 goes high, which turns the PMOS transistor 512 off. The output 412 from the WL logic circuit 520 remains low, and therefore, the NMOS transistor 514 remains off. As a result, the WL 404 is floating, which allows the transitioning DWL 406 to boost the voltage of the WL 404 to resist any instantaneous change in voltage across the capacitance between the WL 404 and DWL 406. The boosting increases the $V_{GS}$ of the access transistors 210, 220 in the bit cell 200, and thereby increases its drive strength (see FIG. 2). The increased drive strength of the access transistors aids in flipping the state of the bit cell 200.

When the write operation is complete at $t_3$, the WE 402 is driven low by the processor (or other circuit), thereby forcing both the WL 404 and the DWL 406 low.

Figure 6:
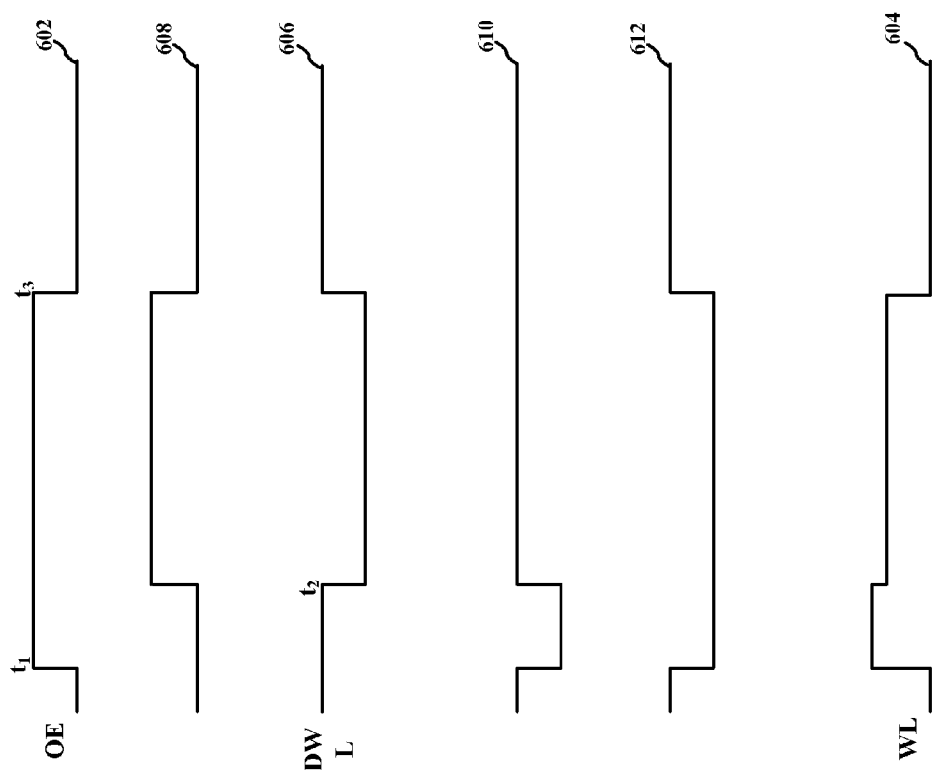
FIG. 6 is a timing diagram illustrating an example of the timing between a word line and a dummy word line for assisting a 6T bit-cell SRAM during a read operation.
Figure 7:
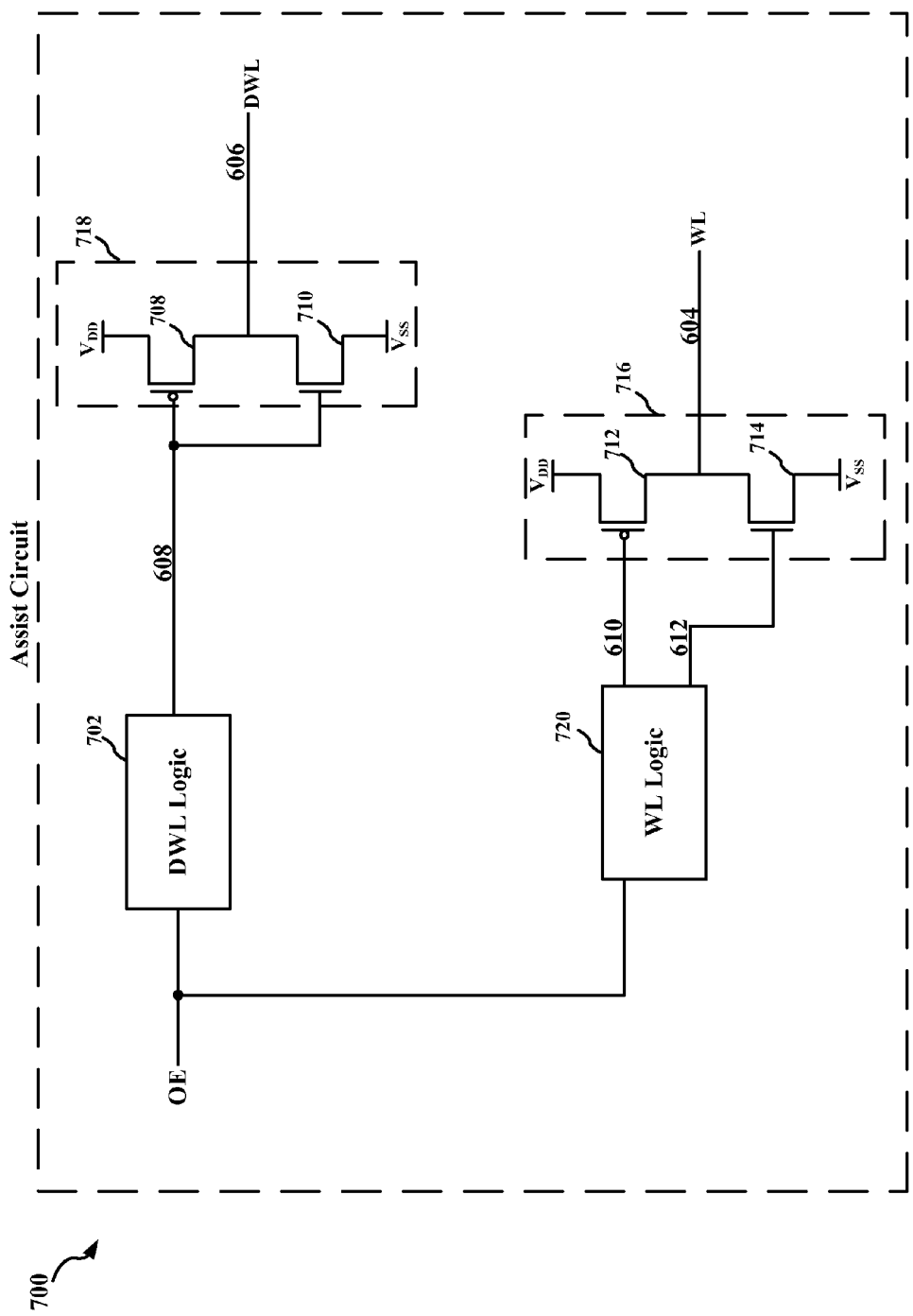
FIG. 7 is a schematic representation illustrating an example of an assist circuit operating in conjunction with a 6T bit-cell SRAM for read assist.

FIG. 6 is a timing diagram illustrating an example of the timing between the WL and the DWL for assisting an SRAM during a read operation. FIG. 7 is a schematic representation illustrating an example of an assist circuit 700 configured to provide read assist to a row of bit-cells having a 6T configuration. The assist circuit 700 is shown with a DWL logic circuit 702 controlling a first CMOS driver 718 outputting the DWL and a WL logic circuit 720 controlling a second CMOS driver 716 outputting the WL. The first CMOS driver 718 includes PMOS transistor 708 and NMOS transistor 710. The second CMOS driver 716 includes PMOS transistor 712 and NMOS transistor 714. The DWL logic circuit 702 and the WL logic circuit 720 may be implemented by any logic combination that results in the output signals 608, 610 and 612 as shown in FIG. 6. Those skilled in the art will be readily able to design logic circuits best suited for the particular application and the overall design constraints imposed on the system.

Referring to FIGS. 6 and 7, the read operation is controlled by a processor or other circuit that requires access to memory. More specifically, the processor (or other circuit) transmits over a bus to the SRAM the address to be read from and an OE signal 602 to enable the read operation. When the SRAM is in standby mode, the OE 602 signal is low. The output 608 from DWL logic circuit 702 is low in response to the low OE signal 602, which turns the PMOS transistor 708 on and the NMOS transistor 710 off, thereby pulling up the DWL 606 to $V_{DD}$. The output 610 from WL logic circuit 720 is high in response to the low OE signal 602, which turns the PMOS transistor 712 off. The output 612 from the WL logic circuit 720 is also high in response to the low OE signal, which turns the NMOS transistor 714 on, thereby pulling down the WL 604 to $V_{SS}$.

The read operation is initiated by asserting the OE signal 602 at the processor or other device at $t_1$. When the OE 602 signal is asserted (i.e., high), the output 608 from DWL logic circuit 702 remains low, and therefore, the DWL 606 remains pulled up to $V_{DD}$. Both the outputs 610 and 612 from the WL logic circuit 720 go low, which turns the PMOS transistor 712 on and the NMOS transistor 714 off, respectively. The PMOS transistor 712 pulls up the WL 604 to $V_{DD}$.

At $t_2$, the output 608 from DWL logic circuit 702 goes high, which turns the PMOS transistor 708 off and the NMOS transistor 710 on, pulling down the DWL 606 to $V_{SS}$. At substantially the same time, the output 610 from the WL logic circuit 720 goes high, which turns the PMOS transistor 712 off. The output 612 from the WL logic circuit 720 remains low, and therefore, the NMOS transistor 714 remains off. As a result, the WL 604 is floating, which allows the transitioning DWL 606 to reduce the voltage of the WL 604 to resist any instantaneous change in voltage across the capacitance between the WL 604 and DWL 606. The method decreases the $V_{GS}$ of the access transistors 210, 220 in the bit cell 200, and thereby increases the noise margin during the read operation (see FIG. 2).

When the read operation is complete at $t_3$, the OE 602 is driven low by the processor (or other circuit), thereby forcing both the WL 604 low and the DWL 606 high.

In the embodiments described thus far, an assist circuit 500 for a write operation may be utilized in an SRAM. Alternatively, or in addition to, an assist circuit 700 for a read operation may be utilized in an SRAM. In those embodiments of an SRAM providing both read and write assist, a separate write assist circuit 500 and a separate read assist circuit 700 may be used. The write assist circuit 500 may be used to control the WL and the DWL during the write operation and the read assist circuit 700 may be used to control the WL and the DWL during the read operation. Alternatively, the write and read assist circuits 500 and 700 may be combined into a single circuit. Those skilled in the art will be readily able to design the appropriate logic to implement both the write and read assist circuits 500 and 700 into a single circuit that functions as described herein.

Figure 8:
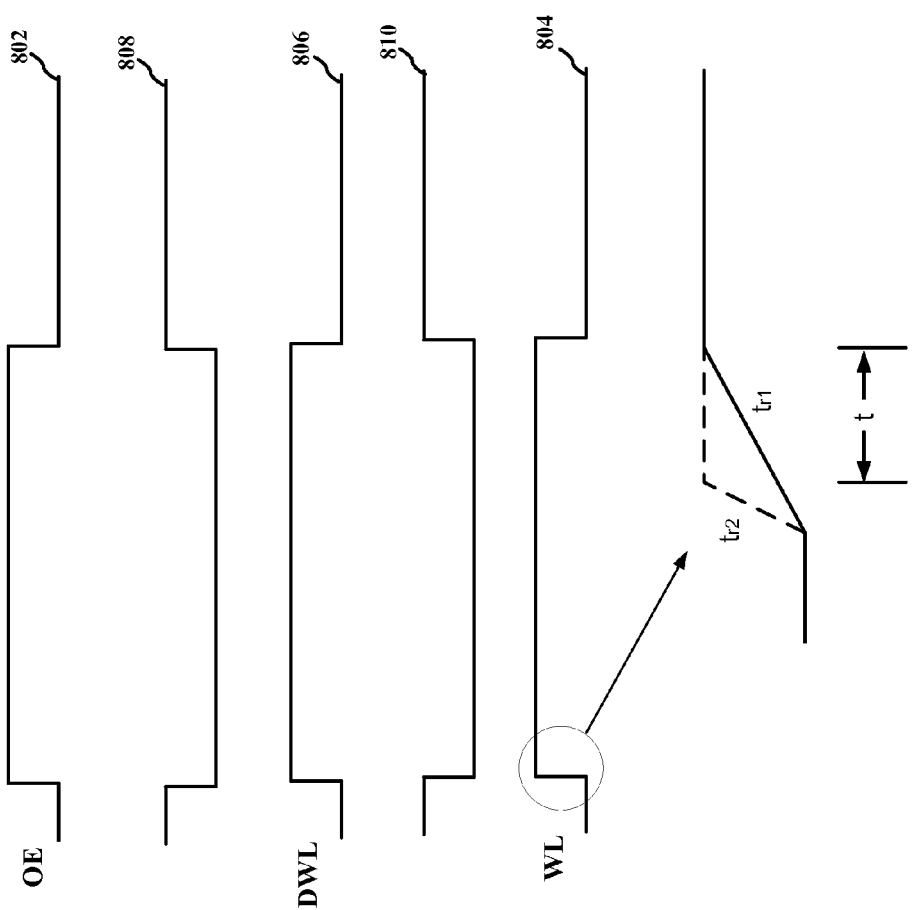
FIG. 8 is a timing diagram illustrating an example of the timing between a word line and a dummy word line for assisting a 6T bit-cell SRAM for speeding up a write and read operation.
Figure 9:
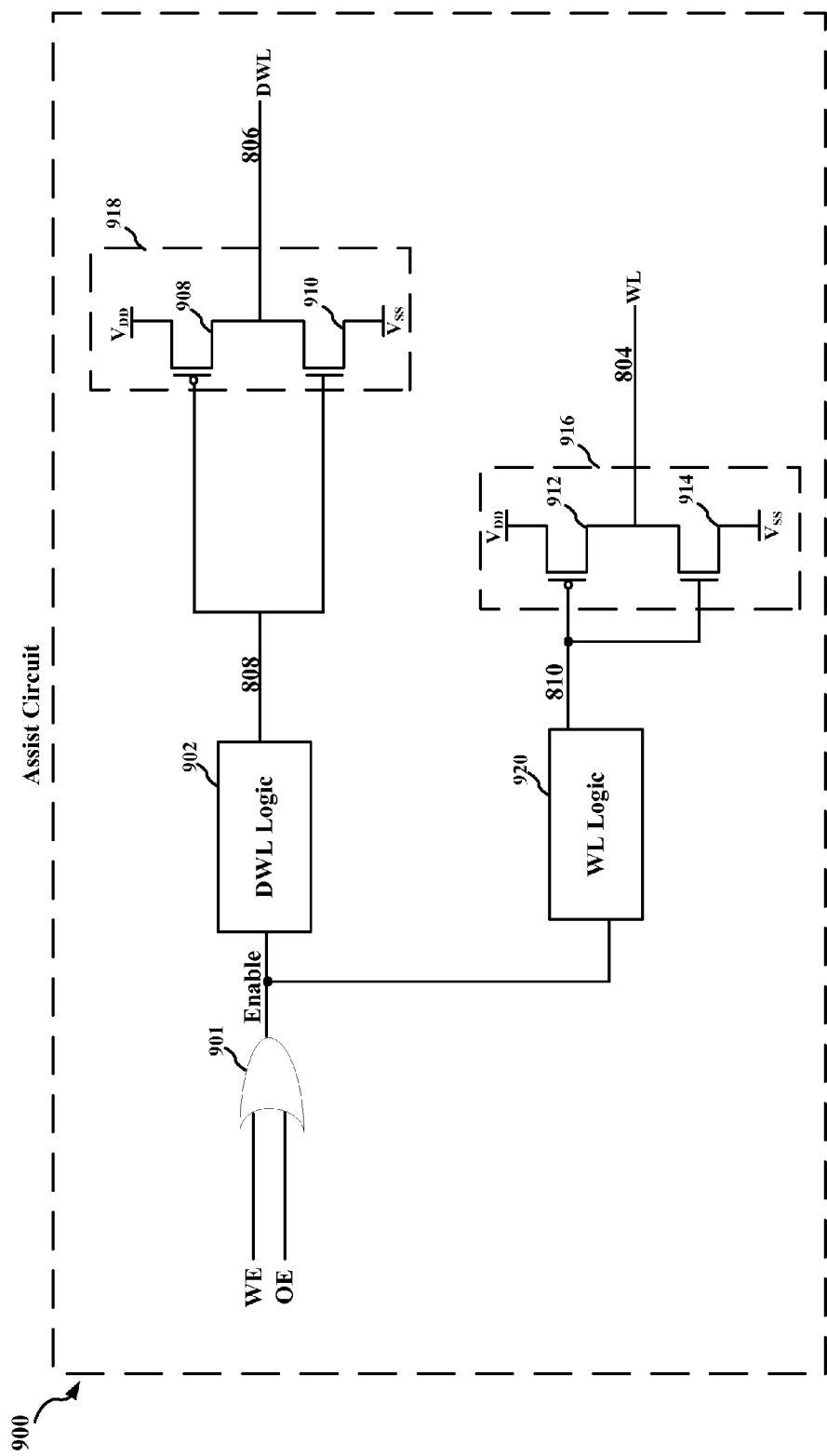
FIG. 9 is a schematic representation illustrating an example of an assist circuit operating in conjunction with a 6T bit-cell SRAM for speeding up a write and read operation.

In an alternative embodiment, the DWL may be used to speed up the read and/or write operations. FIG. 8 is a timing diagram illustrating an example of the timing between the WL and the DWL for speeding up both the read and write operation. FIG. 9 is a schematic representation illustrating an example of an assist circuit 900 configured to speed up both the read and write operation for a row of bit-cells having a 6T configuration. The assist circuit 900 is shown with a DWL logic circuit 902 controlling a first CMOS driver 918 outputting the DWL and a WL logic circuit 920 controlling a second CMOS driver 916. The first CMOS driver 918 includes PMOS transistor 908 and NMOS transistor 910. The second CMOS driver 916 includes PMOS transistor 912 and NMOS transistor 914. The DWL logic circuit 902 and the WL logic circuit 920 may be implemented by any logic combination that results in the output signals 808 and 810 as shown in FIG. 8. Those skilled in the art will be readily able to design logic circuits best suited for the particular application and the overall design constraints imposed on the system.

In the configuration shown, an OR gate 901 may be used to gate the WE and OE to activate the access circuit during both the read and write operation.

In the standby mode, the Enable 802 output from the OR gate 901 signal is low. The output 808 from DWL logic circuit 902 is high in response to the low Enable 802, which turns the PMOS transistor 908 off and the NMOS transistor 910 on, thereby pulling down the DWL 806 to $V_{SS}$. The output 810 from WL logic circuit 920 is also high in response to the low Enable 802, which turns the PMOS transistor 912 off and the NMOS transistor 914 on, thereby pulling down the WL 804 to $V_{SS}$.

The Enable 802 is driven high at the beginning of either the read or write operation.

After the Enable 802 goes high, the output 808 from DWL logic circuit 902 goes low, thereby pulling up the DWL 806 to $V_{DD}$ through the PMOS transistor 908. The output 810 from the WL logic circuit 920 also goes low, which turns the PMOS transistor 912 on and the NMOS transistor 914 off, thereby pulling up the WL 804 to $V_{DD}$ through the PMOS transistor 912. The transitioning DWL 806 assists pulling up the WL 804 due to the capacitance between the two, thereby decreasing the rise time of the WL 804 as shown in the enlarged portion of FIG. 8. As a result of the capacitive coupling, the rise time of the leading edge of the WL 804 is decreased from $t_{r1}$ to $t_{r2}$.

When the read or write operation is complete, the Enable 902 returns to a low state, thereby forcing both the WL 804 and the DWL 806 to their initial low state.

The speed up circuit is particularly useful for SRAMs having a large number of columns. As the number of columns grow, the length of the WL increases, which increases the capacitance. And with high metal resistance and capacitance it makes a significant delay (~RC' delay) to reach WL to last column which in turn, increases the access time of the SRAM. The RC delay of the WL may be decreased by use of the DWL which is a parallel running line and gives a fixed capacitance coupling across increasing number of columns in the manner described above in connection with FIGS. 8 and 9. It converges the degradation of SRAM performance across columns The decrease in rise time is illustrated in the exploded portion of the WL timing diagram in FIG. 8 which contrasts the WL rise time $t_{r1}$ without the DWL against the WL rise time $t_{r2}$ with DWL. As shown, the access time can be increased by t.

Referring to FIGS. 8 and 9, the assist circuit is configured to speed up both the read and write operation. In alternative embodiments, the assist circuit may be configured to provide speed up for either the read or write operation. By way of example, the assist circuit 900 may be used to speed up only the write operation by removing the OR gate 902 and driving the write enable WE signal directly into the input for the DWL and WL logic circuits 902, 920. Similarly, the assist circuit 900 may be used to speed up only the read by removing the OR gate 902 and driving the output enable OE signal directly into the input for DWL and WL logic circuits 902, 920.

Figure 10:
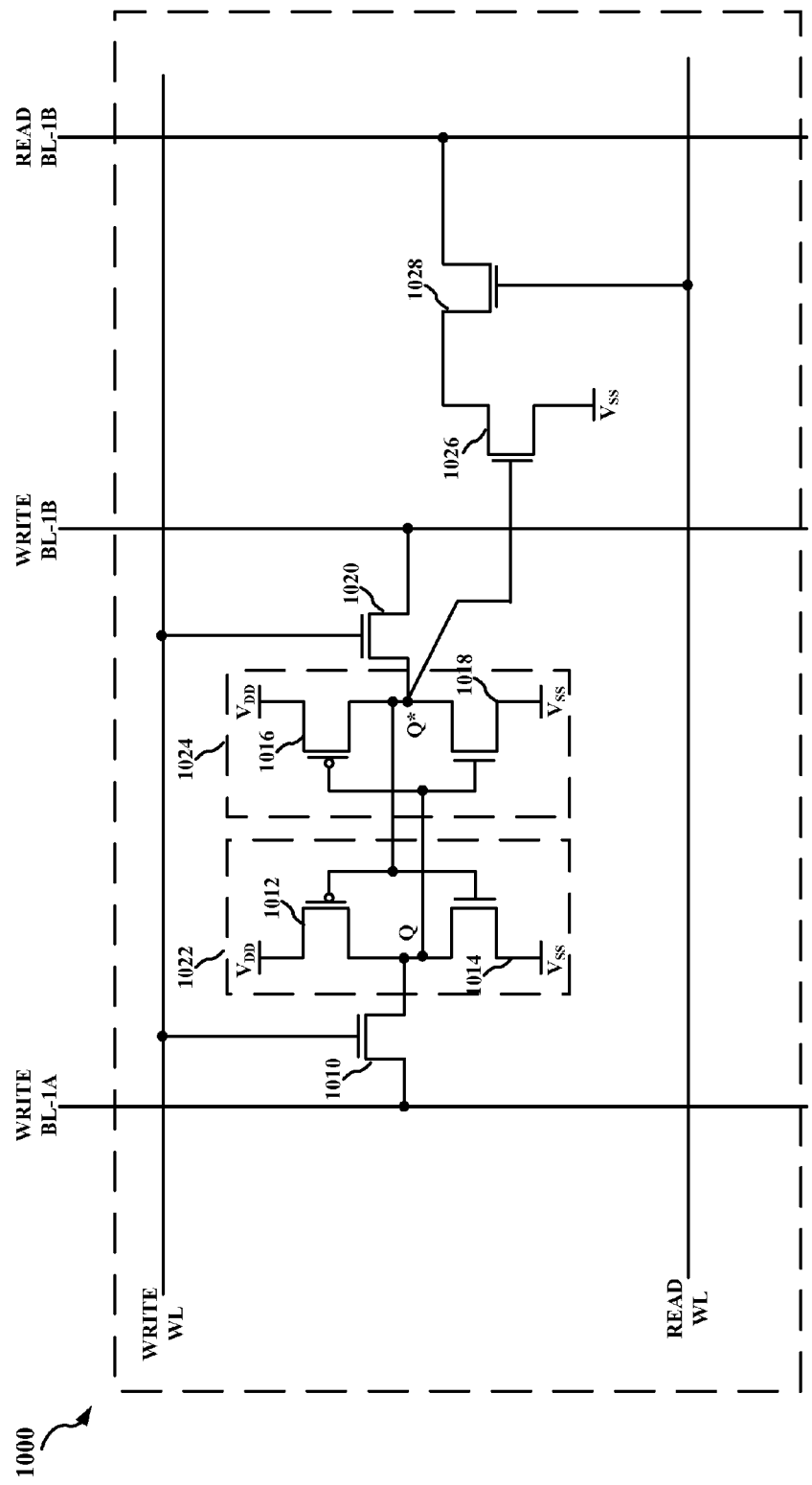
FIG. 10 is a schematic representation illustrating an example of a 8T bit-cell for an SRAM.

Various aspects presented above may be extended to SRAMs with other transistor configurations. By way of example, various techniques to perform read and write assist for an SRAM will now be presented in connection with bit cells having an eight transistor (8T) configuration. FIG. 10 is a schematic representation illustrating one example of a bit-cell 1000 for an SRAM having an 8T configuration. The bit-cell 1000 is shown with two inverters 1022, 1024. The first inverter 1022 comprises a p-channel pull-up transistor 1012 and an n-channel pull-down transistor 1014. The second inverter 1024 comprises a p-channel pull-up transistor 1016 and an n-channel pull-down transistor 1018. The first and second inverters 1022, 1024 are interconnected to form a cross-coupled latch. A first n-channel access transistor 1010 and a second n-channel access transistor 1020 may be used to provide access to the latch during the write operation. The first n-channel access transistor 1010 couples the latch output Q to a first write bit line BL-1A and the second n-channel access transistor 1020 couples the latch output Q* to a second write bit line BL-1B. The gates of the n-channel access transistors 1010, 1020 are coupled to a write word line ("write WL"). A third n-channel access transistor 1028 may be used to provide access to the latch during the read operation. The third n-channel transistor 1028 couples a read bit line BL-1B to an re-channel pull down transistor 1026 which is controlled by the latch output Q*. The gate of the n-channel access transistor 1028 is coupled to a read word line ("read WL").

The read operation is initiated by pre-charging the read bit line BL-1B. Once the read bit line BL-1B is sufficiently charged, the read WL is asserted by setting it high, thereby enabling the access transistor 1028. With the access transistor 1028 enabled, the inverted value stored at the output Q* of the second inverter is provided at the read bit line BL-1B. By way of example, if the output Q* from the second inverter 1024 is a logic level 0, the n-channel transistor 1026 is turned off and the read bit line BL-1B retains its charge (i.e., a logic level 1). If the output Q* from the second inverter 1024 is a logic level 1, the n-channel transistor 1026 is turned on, thereby pulling down the read bit line BL-1B through the access transistor 1028 and the pull down transistor 1026 to $V_{SS}$ (i.e., a logic level 0).

When the read WL is not asserted (i.e., a logic level 0), the access transistor 1028 disconnects the read bit-line BL-1B from the two inverters 1022, 1024. The write operation is initiated by setting the bit-lines, write BL-1B, write BL-1A to the value to be written to bit-cell 1000 and then asserting the write WL. By way of example, a logic level 1 may be written to the bit-cell 1000 by setting the first bit-line write BL-1A to a logic level 1 and the second bit-line write BL-1B to a logic level 0. The logic level 1 at the first bit-line write BL-1A forces the output Q of the first inverter 1022 to a logic level 1 through the access transistor 1010. The logic level 0 at the second bit-line write BL-1B forces the output Q* of the second inverter 1024 to a logic level 0 through the access transistor 1020. The bit-line drivers (not shown) are designed to be stronger than the transistors in the bit-cell 1000 so that they can override the previous state of the cross-coupled inverters 1022, 1024. The output Q of the first inverter 1022 is applied to the input of the second inverter 1024, which reinforces the output Q* of the second inverter 1024 at a logic level 0. The output Q* of the second inverter 1024 is applied to the input of the first inverter 1022, which reinforces the output Q of the first inverter 1022 at a logic level 1. A logic level 0 may be written to the bit-cell 1000 by inverting the values of the bit-lines write BL-1B, write BL-1A.

When the write WL is not asserted (i.e., a logic level 0), the access transistors 1010, 1020 disconnect the bit-lines write BL-1B, write BL-1A from the two inverters 1022, 1024. The output state of the bit-cell 1000 is maintained by the cross-coupling between the two inverters 1022, 1024.

Figure 11:
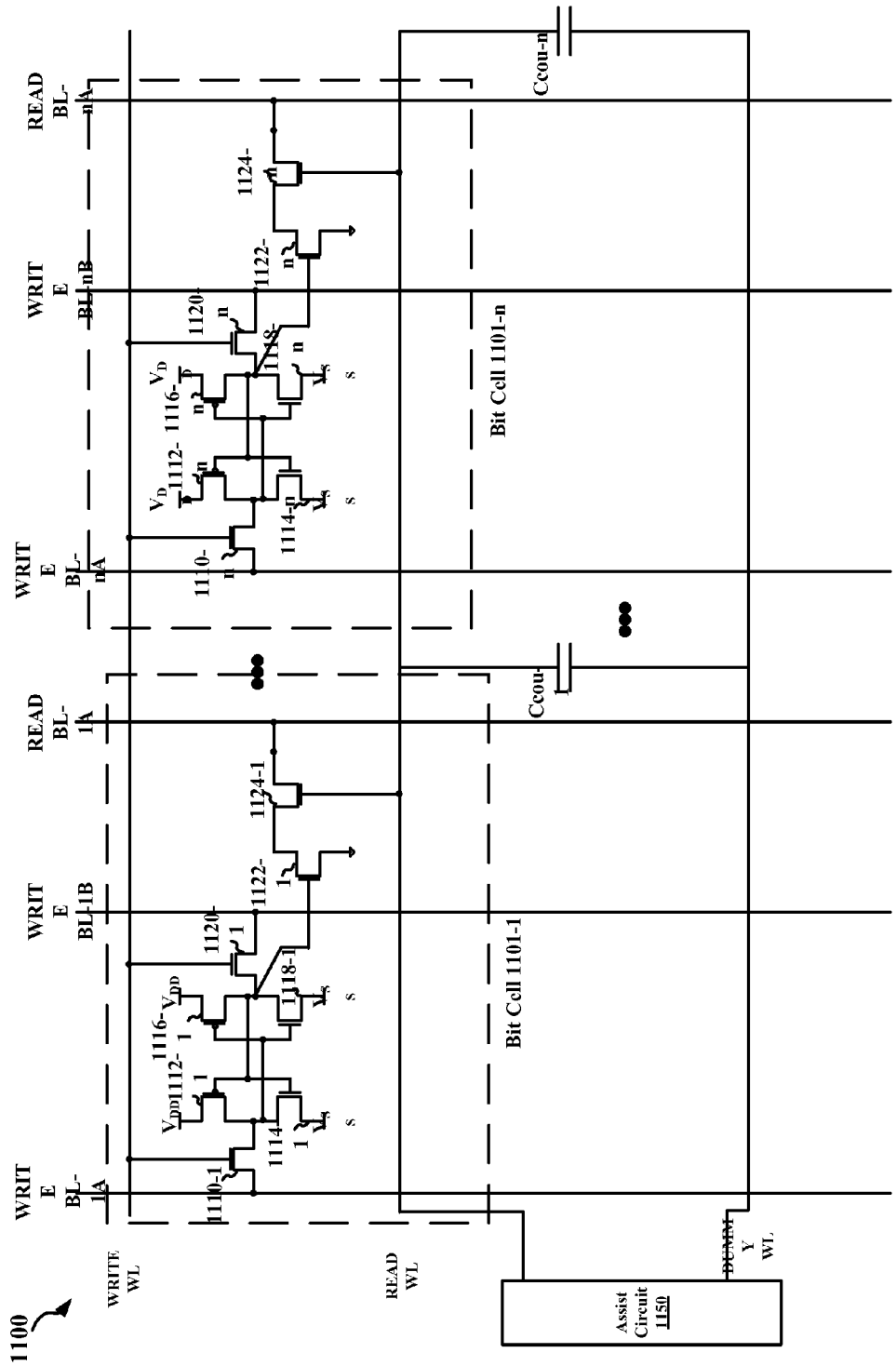
FIG. 11 is a schematic representation illustrating an example of a row of 8T bit-cells in a SRAM.

As explained earlier, the SRAM includes an array of bit-cells with supporting circuitry. The array is arranged in rows and columns of bit-cells. FIG. 11 is a schematic representation 1100 illustrating one example of a row of bit-cells in an SRAM array. Bit Cell 1101-1 includes eight MOSFETs 1110-1, 1112-1, 1114-1, 1116-1, 1118-1, 1120-1, 1122-1, and 1124-1 and write bit lines write BL-1A, BL-1B and read bit line BL-1A. Bit Cell 1101-n includes eight MOSFETs 1110-n, 1112-n, 1114-n, 1116-n, 1118-n, 1120-n, 1122-n, and 1124-n and write bit lines BL-nA, BL-nB and read bit line BL-nA. A write WL and read WL are coupled to each of the bit-cells 1100-1 . . . 1100-n to provide access to the SRAM. In this example, a DWL may be used to boost the read WL during the read operation. The boost voltage during the read operation may be achieved through capacitive coupling between the read WL and DWL represented in FIG. 11 by $C_{cou}$-1 . . . $C_{cou}$-n. An assist circuit 1150 may be used to control the read WL and DWL.

Figure 12:
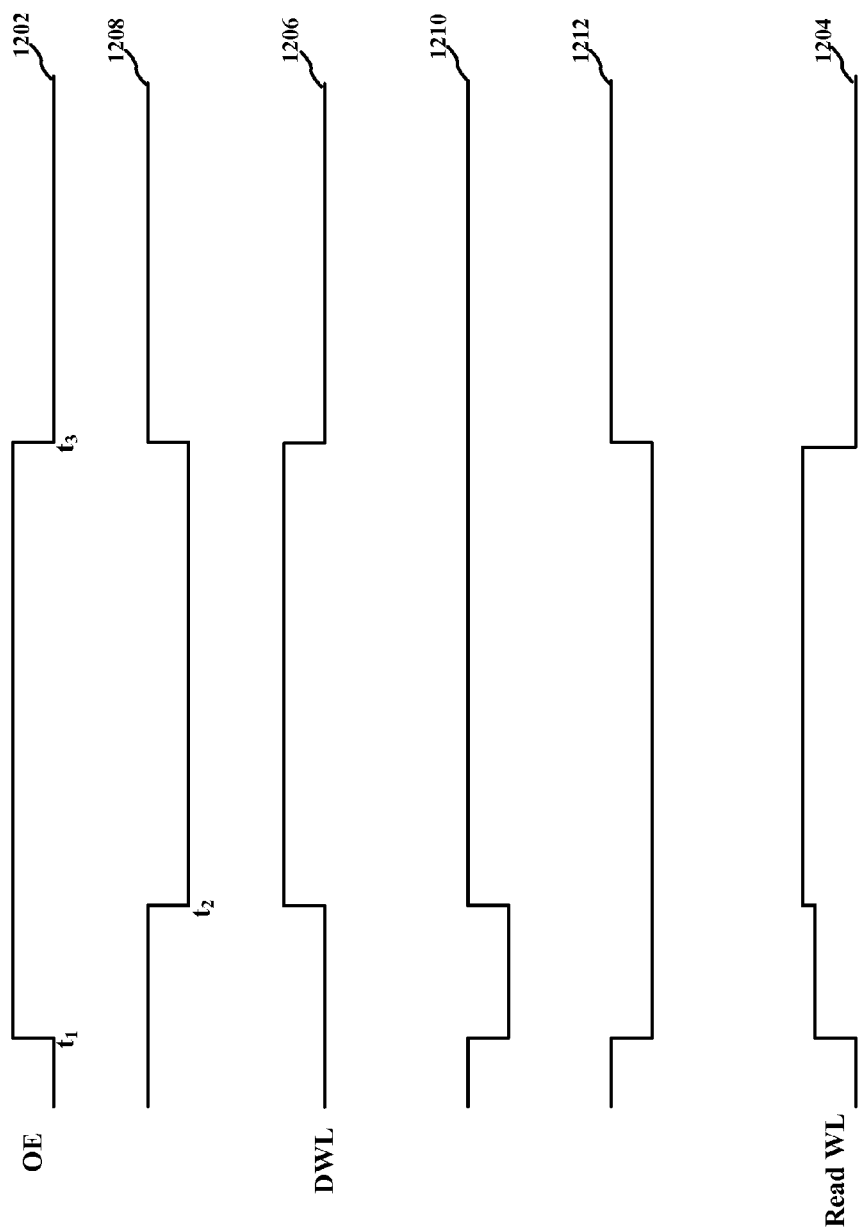
FIG. 12 is a timing diagram illustrating an example of the timing between a word line and a dummy word line for assisting an 8T bit-cell SRAM during a read operation.
Figure 13:
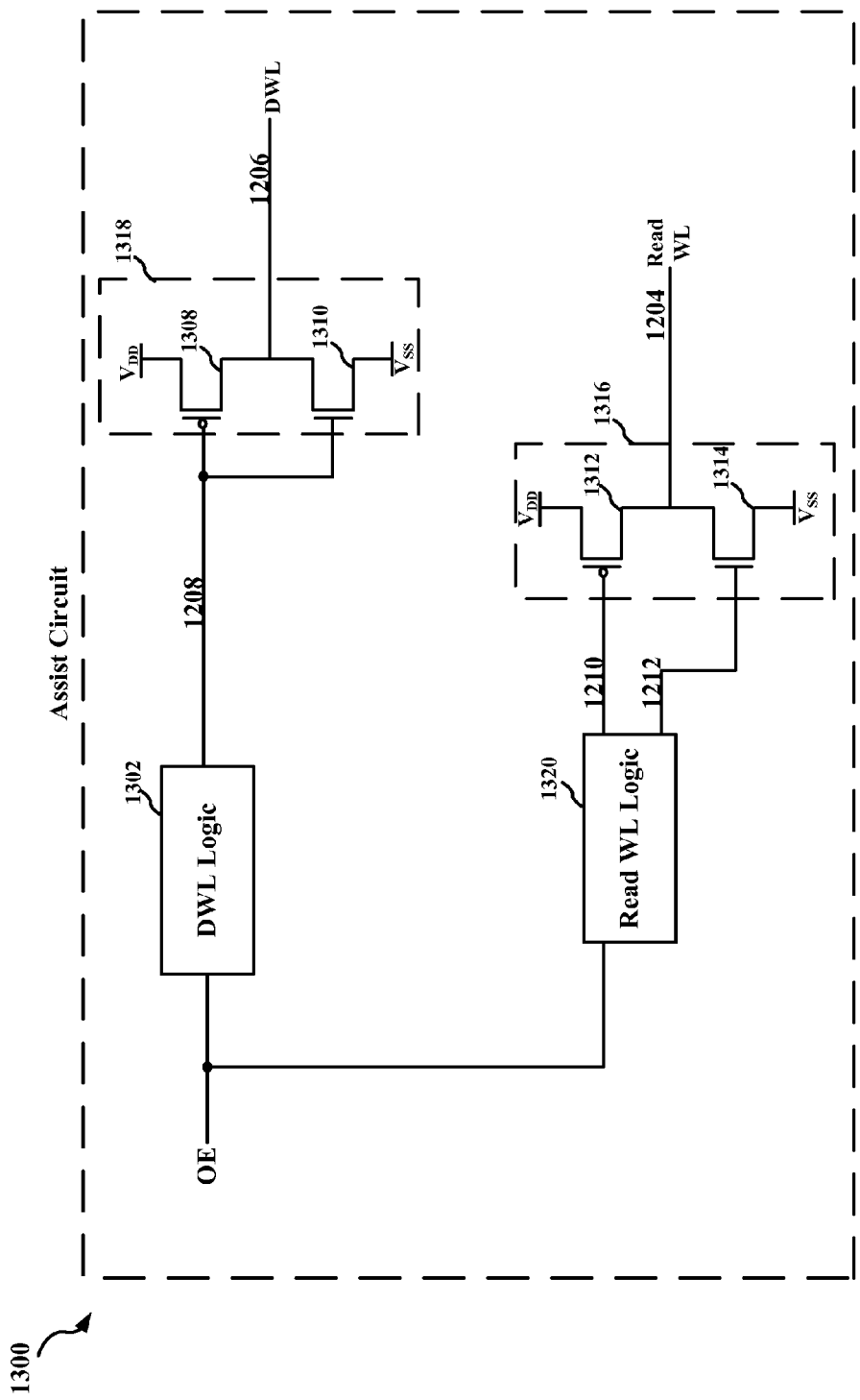
FIG. 13 is a schematic representation illustrating an example of an assist circuit operating in conjunction with an 8T bit-cell SRAM for read assist.

FIG. 12 is a timing diagram illustrating an example of the timing between the read WL and the DWL for assisting an SRAM during a read operation. FIG. 13 is a schematic representation illustrating an example of an assist circuit 1300 configured to provide read assist in an 8T bit-cell configuration. The assist circuit 1300 is shown with a DWL logic circuit 1302 controlling a first CMOS driver 1318 outputting the DWL and a read WL logic circuit 1320 controlling a second CMOS driver 1316. The first CMOS driver 1318 includes PMOS transistor 1308 and NMOS transistor 1310. The second CMOS driver 1316 includes PMOS transistor 1312 and NMOS transistor 1314. The DWL logic circuit 1302 and the read WL logic circuit 1320 may be implemented by any logic combination that results in the output signals 1208, 1210 and 1212 shown in FIG. 12. Those skilled in the art will be readily able to design logic circuits best suited for the particular application and the overall design constraints imposed on the system.

Referring to FIGS. 12 and 13, the read operation is controlled by a processor or other circuit that requires access to memory. More specifically, the processor (or other circuit) transmits over a bus to the SRAM the address in memory the data is to be read from, and an OE signal 1202 to enable the read operation. When the SRAM is in standby mode, the OE 1202 signal is low. The output 1208 from DWL logic circuit 1302 is high in response to the low OE signal 1202, which turns the PMOS transistor 1308 off and the NMOS transistor 1310 on, thereby pulling down the DWL 1206 to $V_{SS}$. The output 1210 from read WL logic circuit 1320 is high in response to the low OE signal 1202, which turns the PMOS transistor 1312 off. The output 1212 from the read WL logic circuit 1320 is also high in response to the low OE signal, which turns the NMOS transistor 1314 on, thereby pulling down the read WL 1204 to $V_{SS}$.

The read operation is initiated by asserting the OE signal 1202 at the processor or other device at $t_1$. When the OE 1202 signal is asserted (i.e., high), the output 1208 from DWL logic circuit 1302 remains high, and therefore, the DWL 1206 remains pulled down to $V_{SS}$. Both the outputs 1210 and 1212 from the read WL logic circuit 1320 go low, which turns the PMOS transistor 1312 on and the NMOS transistor 1314 off, respectively. The PMOS transistor 1312 pulls up the read WL 1204 to $V_{DD}$.

At $t_2$, the output 1208 from DWL logic circuit 1302 goes low, which turns the PMOS transistor 1308 on and the NMOS transistor 1310 off, pulling up the DWL 1206 to $V_{DD}$. At substantially the same time, the output 1210 from the read WL logic circuit 1320 goes high, which turns the PMOS transistor 1312 off. The output 1212 from the read WL circuit 1320 remains low, and therefore, the NMOS transistor 1314 remains off. As a result, the read WL 1204 is floating, which allows the transitioning DWL 1206 to boost the voltage of the read WL 1204 through the capacitive coupling between the two. The boosting increases the $V_{GS}$ of the access transistor 1028 in the bit cell, and thereby increases its drive strength (see FIG. 10). The increased drive strength of the access transistor increases the discharge time of the read BL-1A, and thereby decreases the read access time.

When the read operation is complete at $t_3$, the OE signal 1202 is driven low by the processor (or other circuit), thereby forcing both the read WL 1204 and the DWL 1206 low.

Figure 14:
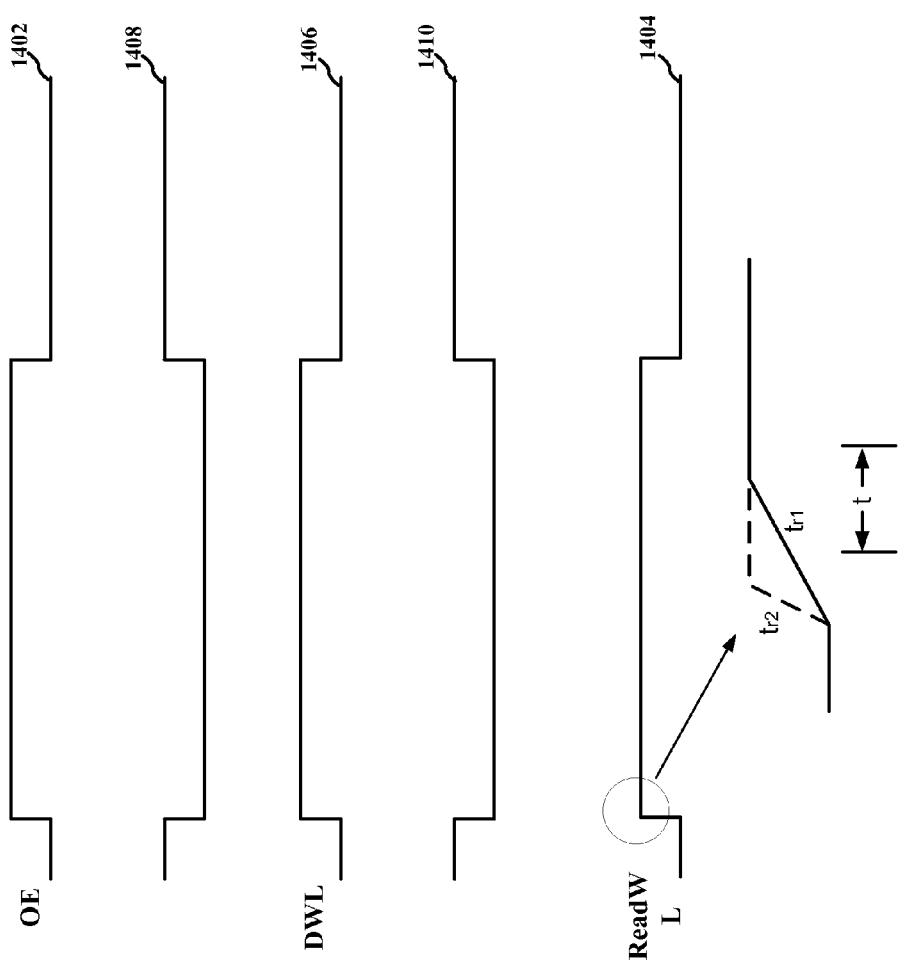
FIG. 14 is a timing diagram illustrating an example of the timing between a word line and a dummy word line for assisting an 8T bit-cell SRAM for speeding up a write and read operation.
Figure 15:
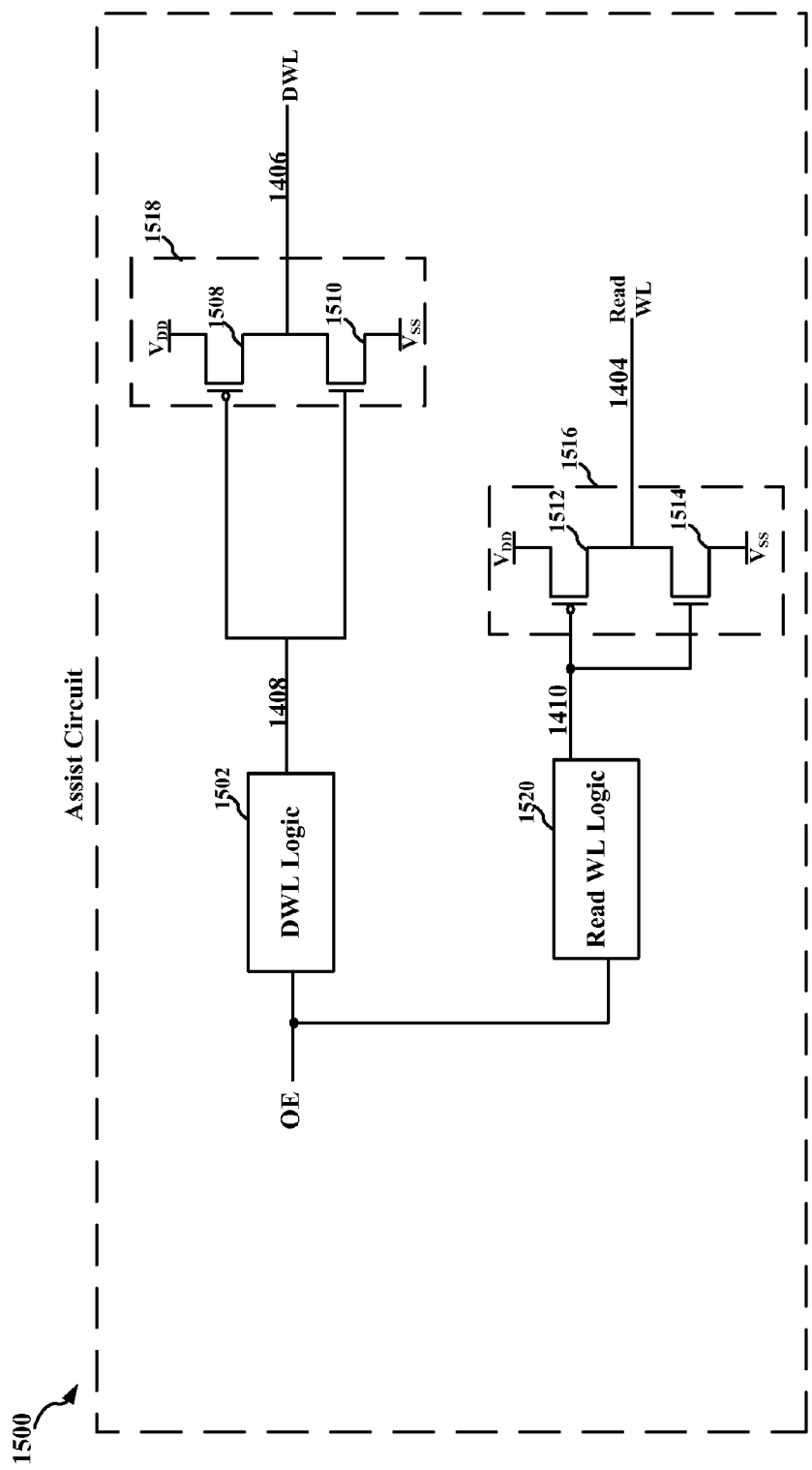
FIG. 15 is a schematic representation illustrating an example of an assist circuit operating in conjunction with an 8T bit-cell SRAM for speeding up a read operation.

In an alternative embodiment, the DWL may be used to speed up the read operation in an 8T bit-cell configuration. FIG. 14 is a timing diagram illustrating an example of the timing between the read WL and the DWL for speeding up the read operation. FIG. 15 is a schematic representation illustrating an example of an assist circuit 1500 configured to speed up the read operation for a row of bit-cells having an 8T configuration. The assist circuit 1500 is shown with a DWL logic circuit 1502 controlling a first CMOS driver 1518 outputting the DWL and a read WL logic circuit 1520 controlling a second CMOS driver 1516. The first CMOS driver 1518 includes PMOS transistor 1508 and NMOS transistor 1510. The second CMOS driver 1516 includes PMOS transistor 1512 and NMOS transistor 1514. The DWL logic circuit 1502 and the read WL logic circuit 1520 may be implemented by any logic combination that results in the output signals 1408 and 1410 as shown in FIG. 14. Those skilled in the art will be readily able to design logic circuits best suited for the particular application and the overall design constraints imposed on the system.

In the standby mode, the OE signal 1402 is low. The output 1408 from DWL logic circuit 1502 is high in response to the low OE 1402, which turns the PMOS transistor 1508 off and the NMOS transistor 1510 on, thereby pulling down the DWL 1406 to $V_{SS}$. The output 1410 from read WL logic circuit 1520 is also high in response to the low OE 1402, which turns the PMOS transistor 1512 off and the NMOS transistor 1514 on, thereby pulling down the read WL 1404 to $V_{SS}$.

The OE 1402 is driven high at the beginning of the read operation. After the OE 1402 goes high, the output 1408 from DWL logic circuit 1502 goes low, thereby pulling up the DWL 1406 to $V_{DD}$ through the PMOS transistor 1508. The output 1410 from the read WL logic circuit 1520 also goes low, which turns the PMOS transistor 1512 on and the NMOS transistor 1514 off, thereby pulling up the read WL 1404 to $V_{DD}$ through the PMOS transistor 1512. The transitioning DWL 1406 assists pulling up the read WL 1404 due to the capacitance between the two, thereby decreasing the rise time of the read WL 1404 as shown in the enlarged portion of FIG. 14. As a result of the capacitive coupling, the rise time of the leading edge of the read WL 1404 is decreased from $t_{r1}$ to $t_{r2}$.

When the read or write operation is complete, the OE 1402 returns to a low state, thereby forcing both the read WL 1404 and the DWL 1406 to their initial low state.

Alternatively, or in addition to, a DWL may be used to boost or speed up the write WL for a row of 8T bit-cells during the write operation through capacitive coupling between a write WL and DWL.

The assist circuit 500 described earlier in connection with FIGS. 4 and 5 may be used to boost the write WL to provide write assist. The only difference is that the assist circuit 500 drives a common WL used for both the read and write operations in the 6T configuration, whereas the assist circuit 500 drives a write WL, which is separate from the read WL, in the 8T configuration. For brevity, a description of the assist circuit 500 will not be repeated here.

The assist circuit 1300 just described in connection with FIGS. 13 and 14 may be used to speed up the write WL during the write operation. The only difference is that the assist circuit 1300 is triggered by the WE rather than the OE, the second CMOS driver 1516 drives the write WL instead of the read WL, and the DWL is arranged with the write WL to form a capacitance therebetween.

In various embodiments that provide both read and write assist, or speed up for both the read and write WLs, in an 8T bit-cell configuration, two DWLs may be employed. The first DWL, or write DWL, may be capactively coupled to the write WL. The second DWL, or the read DWL, may be capacitively coupled to the read WL.

Figure 16:
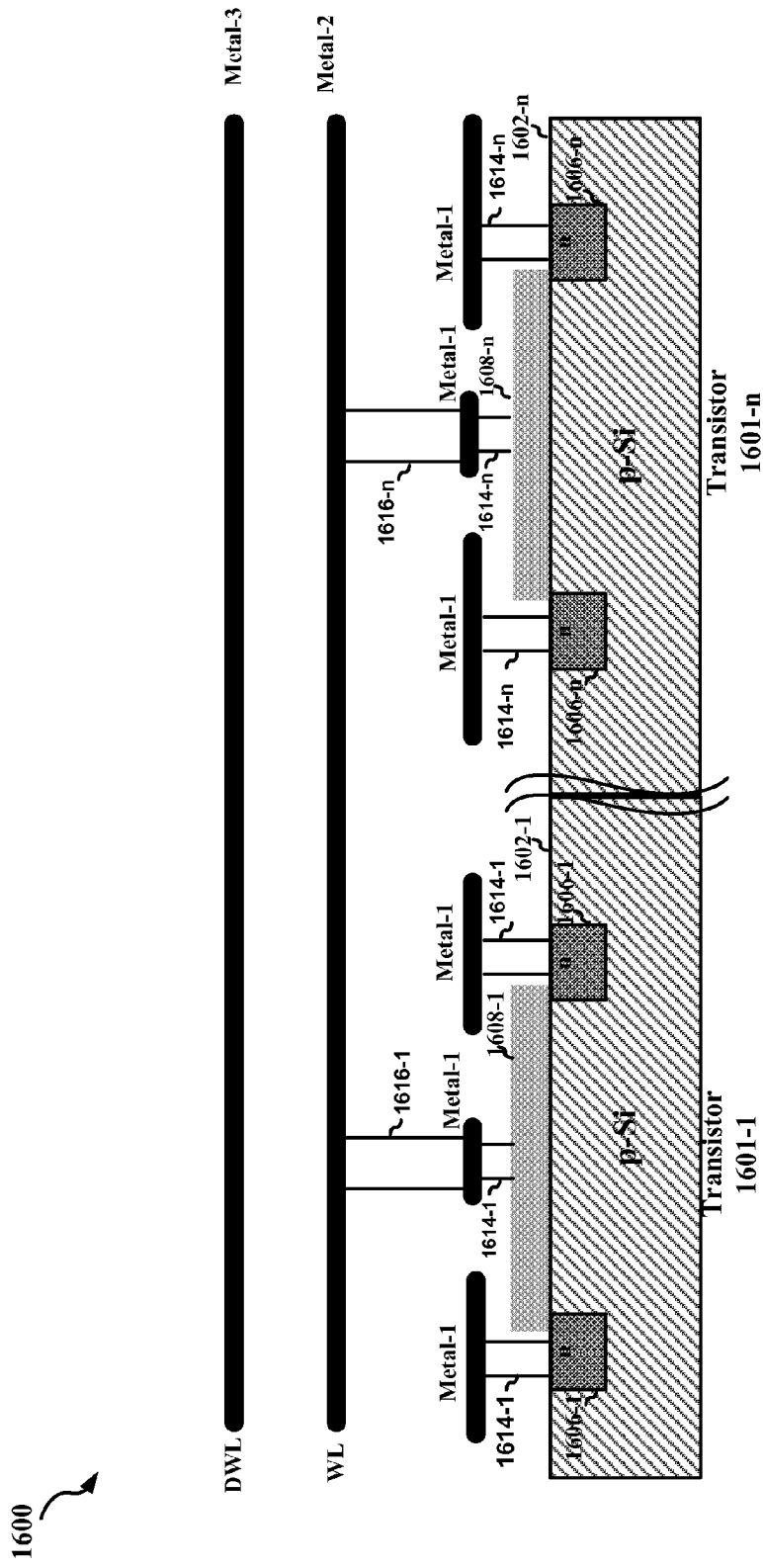
FIG. 16 is a cross-section side view of an integrated circuit illustrating an example of access transistors connected to a word line.

FIG. 16 is a cross-section side view illustrating an example of access transistors for a row of bit-cells in an SRAM. The integrated circuit 1600 is shown with two access transistors 1601-1 and 1601-n formed in the base layer 1602. Access transistor 1601-1 is formed from two n-doped regions 1606-1 in a p-doped semiconductor material by means well known in the art. The gate 1608-1 is formed on a gate oxide layer (not shown) overlaying the p-doped semiconductor material extending between the two n-doped regions 1606-1 by means also well known in the art. Access transistor 1601-n is similarly formed from two n-doped regions 1606-n in a p-doped semiconductor material by means well known in the art. The gate 1608-n is formed on a gate oxide layer (not shown) overlaying the p-doped semiconductor material extending between the two n-doped regions 1606-n by means also well known in the art.

In this example, three metal layers are shown, however, any number of metal layers may be used. Referring to FIG. 16, the first layer, sometimes referred to as the M1 (Metal-1) layer, is used connected to the n-doped regions 1606 by contacts 1614, The M1 layer is used to interconnect the n-doped regions 1606 (i.e., the source and drain) to other components. The WL is formed in the second metal layer, which is sometimes referred to as the M2 (Metal-2) layer. The WL is connected to the gates of the access transistors 1601-1 and 1601-n by vias 1616 that extend between the M1 and M2 layers and the contacts 1614 that extend between the gates and the M1 layer. The WL can be a word line that is common to both the read and write operation in a 6T bit-cell configuration. Alternatively, the WL can be either a read or write word line in an 8T bit-cell configuration. Finally, the DWL is formed in the third metal layer, sometimes referred to as the M3 (Metal-3) layer. The DWL can be a dummy word line that is arranged above the common WL in the 6T bit-cell configuration, or alternatively, a dummy word line that is arranged above either the write WL or read WL in the 8T bit-cell configuration. This arrangement is particularly attractive for smaller process geometries, such as 20 nm technology, because there is adequate space in the M3 layer to form the DWL under standard foundry rules. Thus, the read and write assist can be provided without compromising significant chip area.

The DWL is shown above the WL, however, the DWL may be below the WL or any other location within the integrated circuit that provides suitable capacitive coupling with the WL. Preferably, the DWL has the same length and is substantially parallel to the WL. That is, both the WL and DWL extend across the entire row of bit-cells in a parallel arrangement. This arrangement provides capacitive tracking as the number of columns change for different memory configurations. As a result, a constant voltage boost, or reduction, may be obtained across the entire column. The general equation can be represented by the following formula:

$$V_{cou} = (C_{cou}/C_{Total})V_{Delta}$$

where $V_{cou}$ is the voltage boost or reduction at any point along the WL, $C_{cou}$ is the capacitance between the WL and DWL at any point along the WL, $C_{Total}$ is the total capacitance at any point along the WL, and $V_{Delta}$ is the full voltage swing (i.e., rail-to-rail voltage). By having the DWL and WL length the same and substantially parallel, the variable capacitance $C_{cou}$ along the length of the WL will track the change in $C_{Total}$, thereby resulting in a constant $V_{cou}$. With $V_{Delta}$ at 0.8V, a 40 to 70 mV boost or reduction may be achieved.

Figure 17:
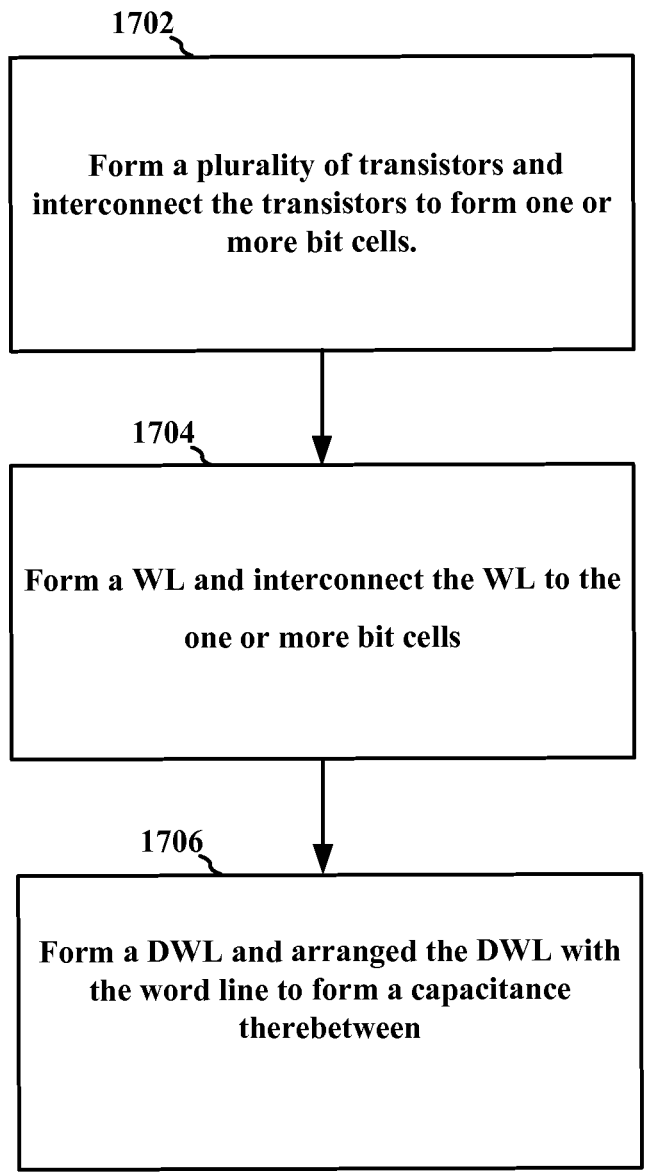
FIG. 17 is a flow chart illustrating an example method of manufacturing an integrated circuit.

FIG. 17 is a flow chart illustrating an example method of manufacturing an integrated circuit. In block 1702 a plurality of transistors are formed and interconnected to form one or more bit cells. In block 1704, a WL is formed and interconnected to the one or more bit cells. In block 1706, a DWL is formed and arranged with the word line to form a capacitance therebetween.

Figure 18:
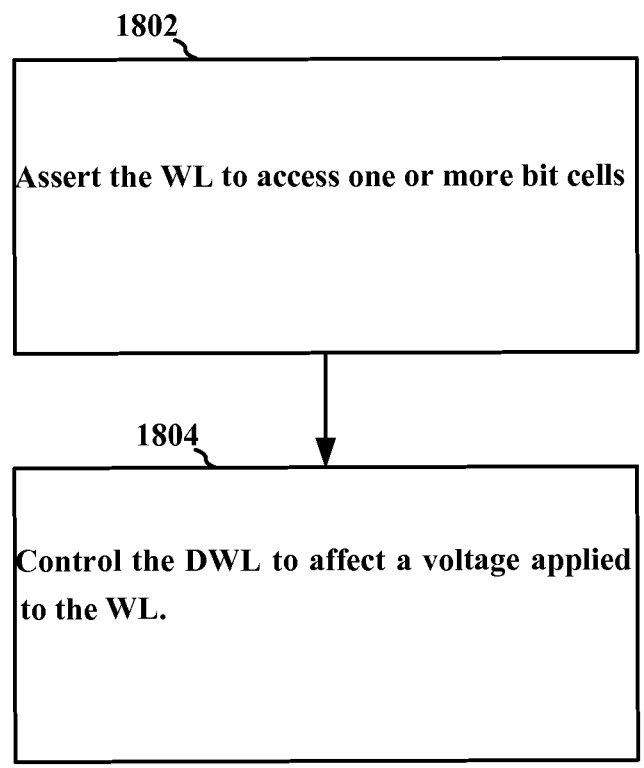
FIG. 18 is a flow chart illustrating an example method of controlling a word line coupled to one or more bit cells formed in an integrated circuit.

FIG. 18 is a flow chart illustrating an example method of controlling a word line coupled to one or more bit cells formed in an integrated circuit. In block 1802, the WL is asserted to access the one or more bit cells. In block 1804, the DWL is controlled to affect a voltage applied to the WL. The voltage is affected by the capacitive coupling between the WL and the DWL.

The various aspects of this disclosure are provided to enable one of ordinary skill in the art to practice the present invention. Various modifications to exemplary embodiments presented throughout this disclosure will be readily apparent to those skilled in the art, and the concepts disclosed herein may be extended to other magnetic storage devices. Thus, the claims are not intended to be limited to the various aspects of this disclosure, but are to be accorded the full scope consistent with the language of the claims. All structural and functional equivalents to the various components of the exemplary embodiments described throughout this disclosure that are known or later come to be known to those of ordinary skill in the art are expressly incorporated herein by reference and are intended to be encompassed by the claims. Moreover, the use of the terms "first," "second," and "third" layers in the claims is not intended to limit the layers to any particular order in the claims unless the order is specifically recited. By way of example, the "third layer" may be above or below the "second layer," either directly or with one or more other layers therebetween. Nothing disclosed herein is intended to be dedicated to the public regardless of whether such disclosure is explicitly recited in the claims. No claim element is to be construed under the provisions of 35 U.S.C. §112(f) unless the element is expressly recited using the phrase "means for" or, in the case of a method claim, the element is recited using the phrase "step for."

What is claimed is:

1. An integrated circuit, comprising:
   one or more bit cells;
   a word line coupled to the one or more bit cells;
   a dummy word line arranged with the word line to have a capacitance therebetween;
   a base layer having a plurality of transistors;
   a first metal layer interconnecting the transistors to form the one or more bit cells;
   a second metal layer comprising the word line; and
   a third metal layer comprising the dummy word line;
   wherein the first metal layer is between the base layer and the second metal layer and the second metal layer is between the first and third metal layers.

2. The integrated circuit of claim 1 further comprising a second word line coupled to the one or more bit cells, the second word line being separate from the word line.

3. The integrated circuit of claim 2 wherein the word line comprises a write word line and the second word line comprises a read word line, or the word line comprises the read word line and the second word line comprises the write word line.

4. The integrated circuit of claim 1 wherein the word line and the dummy word line are substantially parallel to one another.

5. The integrated circuit of claim 1 further comprising an assist circuit configured to control the word line and the dummy word line.

6. The integrated circuit of claim 5 wherein the assist circuit is further configured to assert the word line, and transition the dummy word line after the word line is asserted.

7. The integrated circuit of claim 6 wherein the assist circuit is further configured to float the asserted word line before transitioning the dummy word line.

8. The integrated circuit of claim 6 wherein the assist circuit is further configured to transition the dummy word line to boost a voltage of the asserted word line, thereby providing write assist to the one or more bit cells.

9. The integrated circuit of claim 6 wherein the assist circuit is further configured to transition the dummy word line to boost a voltage of the asserted word line, thereby providing read assist to the one or more bit cells.

10. The integrated circuit of claim 6 wherein the assist circuit is further configured to transition the dummy word line to reduce a voltage of the asserted word line, thereby providing read assist to the one or more bit cells.

11. The integrated circuit of claim 5 wherein the assist circuit is further configured to assert both the word line and the dummy word line simultaneously.

12. An integrated circuit, comprising:
   one or more bit cells;
   a word line coupled to the one or more bit cells;
   dummy word line means for affecting a voltage applied to the word line through a capacitive coupling therebetween;
   a base layer having a plurality of transistors;
   a first metal layer interconnecting the transistors to form the one or more bit cells;
   a second metal layer comprising the word line; and
   a third metal layer comprising the dummy word line means,
   wherein the first metal layer is between the base layer and the second metal layer and the second metal layer is between the first and third metal layers.

13. The integrated circuit of claim 12 further comprising a second word line coupled to the one or more bit cells, the second word line being separate from the word line.

14. The integrated circuit of claim 13 wherein the word line comprises a write word line and the second word line comprises a read word line, or the word line comprises the read word line and the second word line comprises the write word line.

15. The integrated circuit of claim 12 wherein the word line and dummy word line are substantially parallel to one another.

16. The integrated circuit of claim 12 further comprising assist means for controlling the word line and the dummy word line means.

17. The integrated circuit of claim 16 wherein the assist means is configured to assert the word line, and transition the dummy word line means after the word line is asserted.

18. The integrated circuit of claim 17 wherein the assist means is further configured to float the asserted word line before transitioning the dummy word line means.

19. The integrated circuit of claim 17 wherein the assist means is further configured to transition the dummy word line means to boost a voltage of the asserted word line, thereby providing write assist to the one or more bit cells.

20. The integrated circuit of claim 17 wherein the assist means is further configured to transition the dummy word line means to boost a voltage of the asserted word line, thereby providing read assist to the one or more bit cells.

21. The integrated circuit of claim 17 wherein the assist means is further configured to transition the dummy word line means to reduce a voltage of the asserted word line, thereby providing read assist to the one or more bit cells.

22. The integrated circuit of claim 16 wherein the assist means is further configured to assert both the word line and dummy word line simultaneously.

23. A method of manufacturing an integrated circuit, comprising:
   forming a plurality of transistors and interconnecting the transistors to form one or more bit cells;
   forming a word line and interconnecting the word line to the one or more bit cells; and
   forming a dummy word line and arranging the dummy word line with the word line to form a capacitance therebetween,
   wherein the transistors are formed in a base layer and interconnected by a first metal layer, the word line is formed in a second metal layer, and the dummy word line is formed in a third metal layer, and wherein the first metal layer is between the base layer and the second metal layer and the second metal layer is between the first and third metal layers.

24. The method of claim 23 further comprising forming a second word line coupled to the one or more bit cells, the second word line being separate from the word line.

25. The method of claim 24 wherein the word line comprises a write word line and the second word line comprises a read word line, or the word line comprises the read word line and the second word line comprises the write word line.

26. The method of claim 23 further comprising forming a second plurality of transistors in the base layer to form an assist circuit and interconnecting the second plurality of transistors, the word line, and the dummy word line to allow the assist circuit to control the word line and the dummy word line.

27. The method of claim 26 wherein the second plurality of transistors, the word line, and the dummy word line are interconnected such that the assist circuit is configured to assert the word line and transition the dummy word line after the word line is asserted.

28. The method of claim 27 wherein the second plurality of transistors, the word line, and the dummy word line are interconnected such that the assist circuit is configured to float the asserted word line before transitioning the dummy word line.

29. The method of claim 27 wherein the second plurality of transistors, the word line, and the dummy word line are interconnected such that the assist circuit is configured to transition the dummy word line to boost a voltage of the asserted word line, thereby providing write assist to the one or more bit cells.

30. The method of claim 27 wherein the second plurality of transistors, the word line, and the dummy word line are interconnected such that the assist circuit is configured to transition the dummy word line to boost a voltage of the asserted word line, thereby providing read assist to the one or more bit cells.

31. The method of claim 27 wherein the second plurality of transistors, the word line, and the dummy word line are interconnected such that the assist circuit is configured to transition the dummy word line to reduce a voltage of the asserted word line, thereby providing read assist to the one or more bit cells.

32. The method of claim 26 wherein the second plurality of transistors, the word line, and the dummy word line are interconnected such that the assist circuit is configured to assert both the word line and the dummy word line simultaneously.

33. A method of controlling a word line coupled to one or more bit cells formed in an integrated circuit, comprising:
   asserting the word line to access the one or more bit cells; and
   controlling a dummy word line to affect a voltage applied to the word line, the voltage being affected by a capacitive coupling between the word line and the dummy word line,
   wherein the integrated circuit further comprises:
      a base layer having a plurality of transistors;
      a first metal layer interconnecting the transistors to form the one or more bit cells;
      a second metal layer comprising the word line; and
      a third metal layer comprising the dummy word line, and wherein the first metal layer is between the base layer and the second metal layer and the second metal layer is between the first and third metal layers.

34. The method of claim 33 wherein the integrated circuit further comprises a second word line coupled to the one or more bit cells, the second word line being separate from the word line.

35. The method of claim 34 wherein the word line comprises a write word line and the second word line comprises a read word line, or the word line comprises the read word line and the second word line comprises the write word line.

36. The method of claim 33 wherein the controlling of the dummy word line comprises transitioning the dummy word line after the word line is asserted.

37. The method of claim 36 further comprising floating the asserted word line before transitioning the dummy word line.

38. The method of claim 36 wherein the transitioning of the dummy word line comprises boosting the voltage of the asserted word line to provide write assist to the one or more bit cells.

39. The method of claim 36 wherein the transitioning of the dummy word line comprises boosting the voltage of the asserted word line to provide read assist to the one or more bit cells.

40. The method of claim 36 wherein the transitioning of the dummy word line comprises reducing the voltage of the asserted word line to provide read assist to the one or more bit cells.

41. The method of claim 33 wherein the controlling of the dummy word line comprises asserting the dummy word line simultaneously with the word line.

* * * * *